(12) United States Patent
Yokoshima

(10) Patent No.: US 8,837,645 B2
(45) Date of Patent: Sep. 16, 2014

(54) RECEPTION APPARATUS, RECEPTION METHOD, PROGRAM, AND RECEPTION SYSTEM

(75) Inventor: Hideki Yokoshima, Kanagawa (JP)

(73) Assignee: Sony Corporation, Tokyo (JP)

( * ) Notice: Subject to any disclaimer, the term of this patent is extended or adjusted under 35 U.S.C. 154(b) by 378 days.

(21) Appl. No.: 13/067,919

(22) Filed: Jul. 7, 2011

(65) Prior Publication Data

US 2012/0020388 A1    Jan. 26, 2012

(30) Foreign Application Priority Data

Jul. 26, 2010  (JP) ................................. 2010-167312

(51) Int. Cl.
*H03D 1/00* (2006.01)
*H03G 3/30* (2006.01)

(52) U.S. Cl.
CPC .................................. *H03G 3/3068* (2013.01)
USPC ........................................... 375/344; 375/316

(58) Field of Classification Search
USPC .......................................................... 375/344
See application file for complete search history.

(56) References Cited

U.S. PATENT DOCUMENTS

| | | | | |
|---|---|---|---|---|
| 6,191,906 | B1 * | 2/2001 | Buch .............................. | 360/51 |
| 6,563,891 | B1 * | 5/2003 | Eriksson et al. .............. | 375/345 |
| 6,864,818 | B1 * | 3/2005 | Hezar ........................... | 341/143 |
| 2004/0121738 | A1 * | 6/2004 | Ide ................................. | 455/82 |
| 2005/0174274 | A1 * | 8/2005 | Delanghe et al. ............. | 341/139 |
| 2005/0265483 | A1 * | 12/2005 | Erdogan ....................... | 375/316 |
| 2006/0007986 | A1 * | 1/2006 | Larsson ........................ | 375/130 |
| 2006/0281429 | A1 * | 12/2006 | Kishi et al. ................... | 455/313 |
| 2007/0053451 | A1 | 3/2007 | French et al. | |
| 2010/0099363 | A1 * | 4/2010 | Faust et al. ..................... | 455/69 |
| 2012/0134402 | A1 * | 5/2012 | Komaili et al. ............... | 375/224 |
| 2012/0274495 | A1 * | 11/2012 | Van Veldhoven ............. | 341/143 |

FOREIGN PATENT DOCUMENTS

| | | |
|---|---|---|
| FR | 2 625 387 A1 | 6/1989 |
| JP | 03-229517 | 1/1991 |
| JP | 07-321767 | 12/1995 |
| JP | 09-284071 | 10/1997 |
| JP | 2005-286806 A | 10/2005 |
| JP | 2009-081568 | 4/2009 |
| JP | 2009-212957 | 9/2009 |
| JP | 2009-253558 A | 10/2009 |

OTHER PUBLICATIONS

Extended European Search Report issue Sep. 12, 2011 for corresponding European Application No. 11 17 4319.
European Patent Office Communication Pursuant to Article 94(2) EPC issued on Nov. 5, 2013 for corresponding European Application No. 11 174 319.1.
Japanese Office Action issued Mar. 4, 2014 for corresponding Japanese Application No. 2010-167312.

* cited by examiner

*Primary Examiner* — Erin File
(74) *Attorney, Agent, or Firm* — Rader, Fishman & Grauer PLLC

(57) ABSTRACT

Disclosed herein is a reception apparatus including: a reception section configured to receive a signal at a frequency being changed; and a control section configured such that before changing the frequency to receive the signal, the control section stores control information about the reception section receiving the signal at the current frequency as last control information and that upon receiving again the signal at the frequency in effect before the change, the control section sets the last control information to the reception section as an initial value.

7 Claims, 19 Drawing Sheets

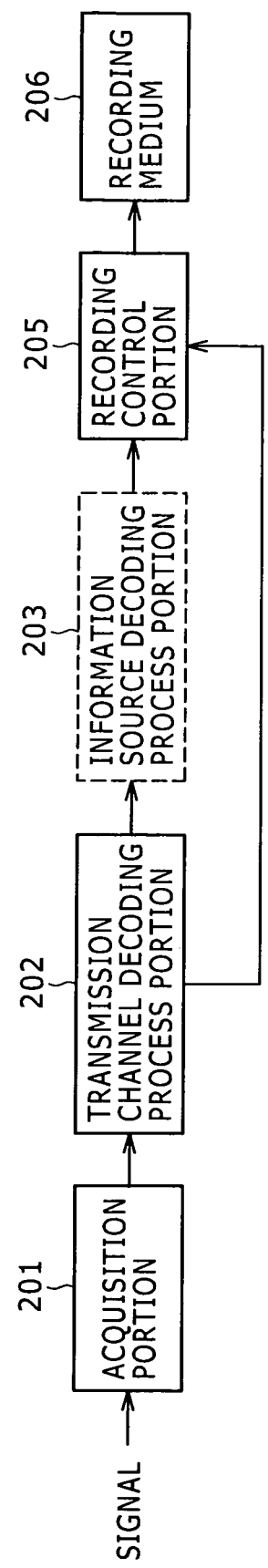

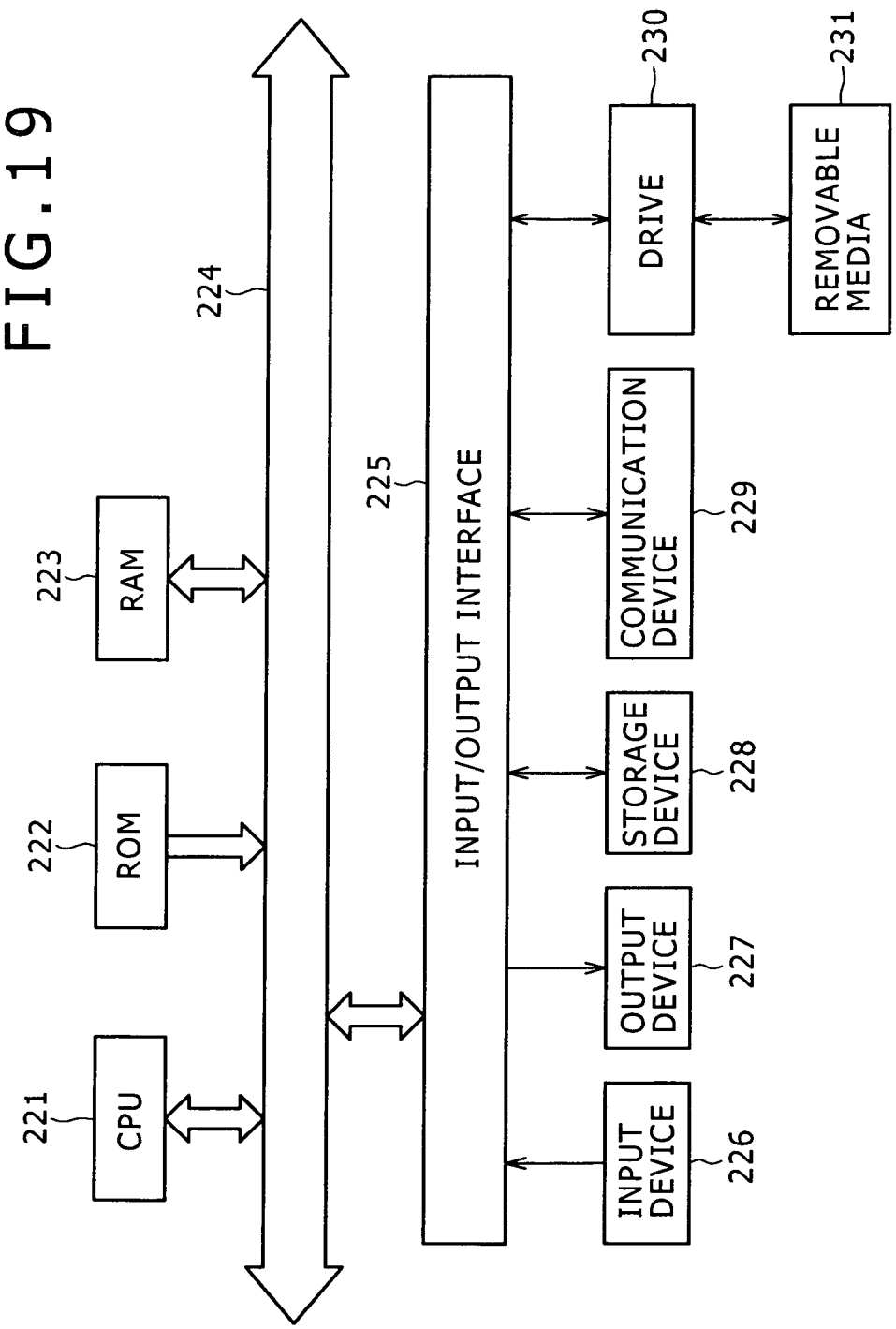

RECEPTION APPARATUS, RECEPTION METHOD, PROGRAM, AND RECEPTION SYSTEM

BACKGROUND

The present disclosure relates to a reception apparatus, a reception method, a program, and a reception system. More particularly, the disclosure relates to a reception apparatus, a reception method, a program, and a reception system for rapidly tuning in to a reception frequency.

There exist frequency-hopping communication apparatuses for transmitting and receiving signals at a frequency being changed at very short intervals (e.g., at intervals of 0.1 second or thereabout). One such communication apparatus is disclosed in Japanese Patent Laid-Open No. 2009-212957. There also exist reception apparatuses for receiving terrestrial digital TV broadcast signals. One such reception apparatus is disclosed in Japanese Patent Laid-Open No. 2009-81568.

SUMMARY

For example, where the frequency-hopping scheme is adopted to transmit digital TV broadcast signals, reception apparatuses may be required to change reception frequencies at short intervals (e.g., at intervals of 5 milliseconds or less). That is, it may be necessary for the reception apparatus to tune in rapidly to the reception frequency.

The present disclosure has been made in view of the above circumstances and provides a reception apparatus, a reception method, a program, and a reception system capable of rapidly tuning in to the reception frequency.

According to one embodiment of the present disclosure, there is provided a reception apparatus including: a reception section configured to receive a signal at a frequency being changed; and a control section configured such that before changing the frequency to receive the signal, the control section stores control information about the reception section receiving the signal at the current frequency as last control information and that upon receiving again the signal at the frequency in effect before the change, the control section sets the last control information to the reception section as an initial value.

According to another embodiment of the present disclosure, there is provided a reception method for use with a reception apparatus, the reception method including: causing the reception apparatus to receive a signal at a frequency being changed; before changing the frequency to receive the signal, causing the reception apparatus to store control information about receiving the signal at the current frequency as last control information; and upon receiving again the signal at the frequency in effect before the change, causing the reception apparatus to set the last control information as an initial value.

According to a further embodiment of the present disclosure, there is provided a program for use with a computer, the program executing a procedure including: causing the computer to receive a signal at a frequency being changed; before changing the frequency to receive the signal, causing the computer to store control information about receiving the signal at the current frequency as last control information; and upon receiving again the signal at the frequency in effect before the change, causing the computer to set the last control information as an initial value.

Where the above-outlined reception process, reception method, or program is in use, the control information about the reception at the current frequency is stored as the last control information. When the signal is again received at the frequency in effect before the change, the last control information is set as the initial value.

According to an even further embodiment of the present disclosure, there is provided a reception system including: a reception section configured to receive a signal at a frequency being changed; and a transmission channel decoding process section configured to perform a transmission channel decoding process on the signal received by the reception section. The reception section includes a control section configured such that before changing the frequency to receive the signal, the control section stores control information about the reception section receiving the signal at the current frequency as last control information and that upon receiving again the signal at the frequency in effect before the change, the control section sets the last control information to the reception section as an initial value.

Where the above-outlined reception system is in use, the reception section first receives a signal at a frequency being changed. The transmission channel decoding process section then performs the transmission channel decoding process on the received signal. The reception section stores the control information about the reception at the current frequency as the last control information. Upon receiving again the signal at the frequency in effect before the change, the reception section sets the last control information as the initial value.

According to a still further embodiment of the present disclosure, there is provided a reception system including: a reception section configured to receive a signal at a frequency being changed; a transmission channel decoding process section configured to perform a transmission channel decoding process on the signal received by the reception section; and an information source decoding process section configured to perform an information source decoding process on the signal having undergone the transmission channel decoding process performed by the transmission channel decoding process section. The reception section includes a control section configured such that before changing the frequency to receive the signal, the control section stores control information about the reception section receiving the signal at the current frequency as last control information and that upon receiving again the signal at the frequency in effect before the change, the control section sets the last control information to the reception section as an initial value.

Where the above-outlined reception system is in use, the reception section first receives a signal at a frequency being changed. The transmission channel decoding process section then performs the transmission channel decoding process on the signal received by the reception section. The information source decoding process section performs the information source decoding process on the signal having undergone the transmission channel decoding process performed by the transmission channel decoding process section. The reception section stores the control information about the reception at the current frequency as the last control information. Upon receiving again the signal at the frequency in effect before the change, the reception section sets the last control information as the initial value.

According to a yet further embodiment of the present disclosure, there is provided a reception system including: a reception section configured to receive a signal at a frequency being changed; a transmission channel decoding process section configured to perform a transmission channel decoding process on the signal received by the reception section; an information source decoding process section configured to perform an information source decoding process on the signal having undergone the transmission channel decoding process performed by the transmission channel decoding process section; and an output section configured to output either an image or a sound based on the signal having undergone the information source decoding process performed by the information source decoding process section. The reception section includes a control section configured such that before changing the frequency to receive the signal, the control section stores control information about the reception section receiving the signal at the current frequency as last control information and that upon receiving again the signal at the frequency in effect before the change, the control section sets the last control information to the reception section as an initial value.

Where the above-outlined reception system is in use, the reception section first receives a signal at a frequency being changed. The transmission channel decoding process section then performs the transmission channel decoding process on the signal received by the reception section. The information source decoding process section performs the information source decoding process on the signal having undergone the transmission channel decoding process performed by the transmission channel decoding process section. The output section outputs either an image or a sound based on the signal having undergone the information source decoding process performed by the information source decoding process section. The reception section stores the control information about the reception at the current frequency as the last control information. Upon receiving again the signal at the frequency in effect before the change, the reception section sets the last control information as the initial value.

According to another embodiment of the present disclosure, there is provided a reception system including: a reception section configured to receive a signal at a frequency being changed; a transmission channel decoding process section configured to perform a transmission channel decoding process on the signal received by the reception section; an information source decoding process section configured to perform an information source decoding process on the signal having undergone the transmission channel decoding process performed by the transmission channel decoding process section; and a recording section configured to control recording of the signal having undergone the information source decoding process performed by the information source decoding process section. The reception section includes a control section configured such that before changing the frequency to receive the signal, the control section stores control information about the reception section receiving the signal at the current frequency as last control information and that upon receiving again the signal at the frequency in effect before the change, the control section sets the last control information to the reception section as an initial value.

Where the above-outlined reception system is in use, the reception section first receives a signal at a frequency being changed. The transmission channel decoding process section then performs the transmission channel decoding process on the signal received by the reception section. The information source decoding process section performs the information source decoding process on the signal having undergone the transmission channel decoding process performed by the transmission channel decoding process section. The recording section controls recording of the signal having undergone the information source decoding process performed by the information source decoding process section. The reception section stores the control information about the reception at the current frequency as the last control information. Upon receiving again the signal at the frequency in effect before the change, the reception section sets the last control information as the initial value.

According to any one of the above-outlined embodiments of the present disclosure, it is possible to tune in rapidly to the reception frequency in use.

BRIEF DESCRIPTION OF THE DRAWINGS

FIG. 18 is a block diagram showing a third configuration example of the reception system to which the reception apparatus of FIG. 1 may be applied; and FIG. 19 is a block diagram showing a typical structure of an embodiment of a computer according to the embodiments of the present disclosure.

DETAILED DESCRIPTION OF THE PREFERRED EMBODIMENTS

Some preferred embodiments (called the embodiment hereunder where appropriate) of the present disclosure will now be described. The description will be given under the following headings:
1. Embodiment of the reception apparatus according to the embodiments of the present disclosure;
2. Structure examples of the ordinary tuner;
3. First embodiment of the tuner used in the reception apparatus of the present disclosure;
4. Variation of the first embodiment of the tuner;

5. Second embodiment of the tuner used in the reception apparatus of the present disclosure;
6. Variations of the second embodiment of the tuner;
7. Another embodiment of the reception apparatus of the present disclosure; and
8. Embodiments of the reception system to which the reception apparatus of the present disclosure may be applied.

<1. Embodiment of the Reception Apparatus According to the Present Disclosure>

[Structure Example of the Reception Apparatus]

Figure 1:
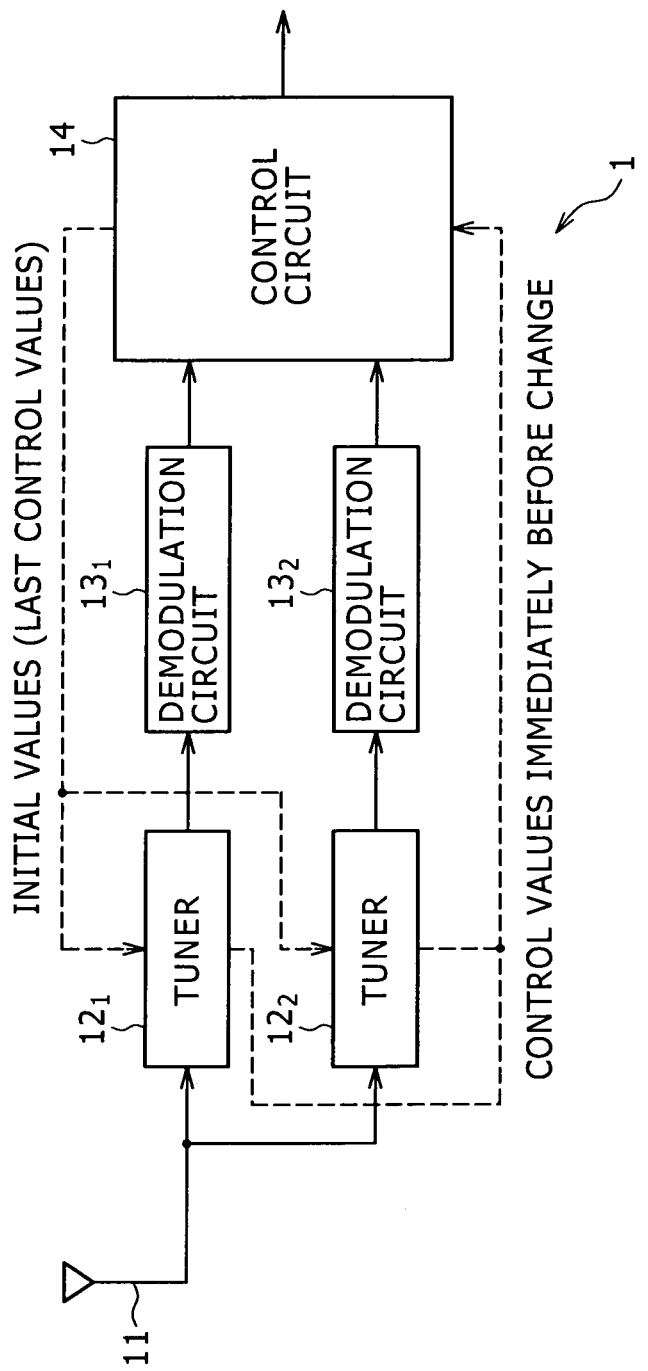
FIG. 1 is a block diagram showing a typical structure of an embodiment of a reception apparatus according to the embodiments of the present disclosure.

FIG. 1 shows a typical structure of an embodiment of a reception apparatus 1 according to the present disclosure.

The reception apparatus 1 in FIG. 1 is made up of an antenna 11, tuners $12_1$ and $12_2$, demodulation circuits $13_1$ and $13_2$, and a control circuit 14.

For example, the reception apparatus 1 may receive and demodulate a radio frequency signal (called the RF signal hereunder) at a frequency corresponding to a predetermined channel of a terrestrial digital broadcast (the frequency is called the reception frequency), and output a video signal and an audio signal derived from the demodulation. It is assumed that the broadcast signal received by the reception apparatus 1 is transmitted under the frequency-hopping scheme at the frequency being changed at intervals of a predetermined time period (i.e., at intervals of 0.1 second or thereabout).

The tuners $12_1$ and $12_2$ receive via the antenna 11 the RF signal at a desired reception frequency of the terrestrial digital broadcast. Each of the tuners $12_1$ and $12_2$ extracts an IF (intermediate frequency) signal from the received RF signal and outputs the extracted IF signal to downstream sections. That is, the tuners $12_1$ and $12_2$ output the IF signal to the demodulation circuit $13_1$ and $13_2$, respectively. In the ensuing description, the tuners $12_1$ and $12_2$ will be simply referred to as the tuner 12 where there is no specific need to distinguish one from the other.

Upon change of the reception frequency, the tuner 12 supplies the control circuit 14 with the control value set inside the tuner immediately before the frequency change as the last control value. Also upon change of the reception frequency, the tuner 12 acquires from the control circuit 14 the last control value regarding the reception frequency to change to (i.e., changed reception frequency) and sets the acquired value inside as the initial value.

The demodulation circuit $13_1$ demodulates the IF signal fed from the tuner $12_1$, and supplies the video and audio signals acquired from the demodulation (i.e., baseband signal) to the control circuit 14. Likewise, the demodulation circuit $13_2$ demodulates the IF signal fed from the tuner $12_2$ and supplies the video and audio signals acquired therefrom (baseband signal) to the control circuit 14. In the ensuing description, the demodulation circuits $13_1$ and $13_2$ will be simply referred to as the demodulation circuit 13 where there is no specific need to distinguish one from the other.

The number of the tuners 12 or that of the demodulation circuits 13 is not limited to two; there may be provided three or more tuners 12 and three or more modulation circuits 13. However, the number of the tuners 12 or that of the demodulation circuits 13 is to be smaller than the number of the frequency bands for use in frequency hopping.

Upon receipt of a channel change instruction from the control portion of a TV receiver or like equipment (not shown) incorporating the reception apparatus 1, the control circuit 14 controls the tuner 12 to receive the reception frequency corresponding to the desired channel. The control circuit 14 also controls the tuner 12 in accordance with the reception frequency being changed at intervals of a predetermined time period under the frequency-hopping scheme. At this point, the control circuit 14 performs control so that the tuners $12_1$ and $12_2$ take turns to receive the desired reception frequency. For example, suppose that while the tuner $12_1$ is receiving the signal at a first reception frequency, it is desired to receive the signal at a second reception frequency. In that case, the control circuit 14 performs control in such a manner that the tuner $12_2$ receives the signal at the second reception frequency. Later, if it is desired to receive the signal at a third reception frequency, the control circuit 14 controls the tuner $12_1$ to receive the signal at the third reception frequency. In this manner, the tuners may be alternated to tune in quickly to the desired reception frequency.

Where it is desired for the tuner 12 receiving the signal at the first reception frequency to receive the signal at the second reception frequency, the control circuit 14 first acquires from the tuner 12 the control value of the first reception frequency as the current reception frequency and stores the acquired value as the last control value. The control circuit 14 then supplies the tuner 12 with the initial value composed of the control value stored as the last control value when the tuner 12 previously received the signal at the changed second frequency. In this manner, the last control value is stored and later used as the initial value next time the tuner 12 tunes in to the applicable reception frequency. This makes it possible to tune in rapidly to the desired reception frequency.

The control circuit 14 selects the video and audio signals fed from either of the demodulation circuits $13_1$ and $13_2$ and outputs the selected signals to downstream blocks such as an error correction circuit.

In the reception apparatus 1 structured as explained above, the tuner 12 receives the signal at the frequency being changed at intervals of a predetermined time period. Before the reception frequency is changed, the control circuit 14 stores the control information (control value) about the tuner 12 receiving at the current frequency as the last control information. When the signal is again received at the frequency in effect before the frequency change, the control circuit 14 sets the last control information to the tuner 12 as the initial value.

<2. Structure Examples of the Ordinary Tuner>

[First Structure Example of the Ordinary Tuner]

Prior to a subsequent explanation of a detailed typical structure of the tuner 12 for use by the reception apparatus of the embodiment of the present disclosure, typical structures of the ordinary tuner are described below. Two typical structure examples of the ordinary tuner will be explained: a first example (FIG. 2) that excludes an AGC (automatic gain control) loop formed solely by analog circuitry, and a second example (FIG. 3) in which there exists an AGC loop consisting of analog circuitry only.

Figure 2:
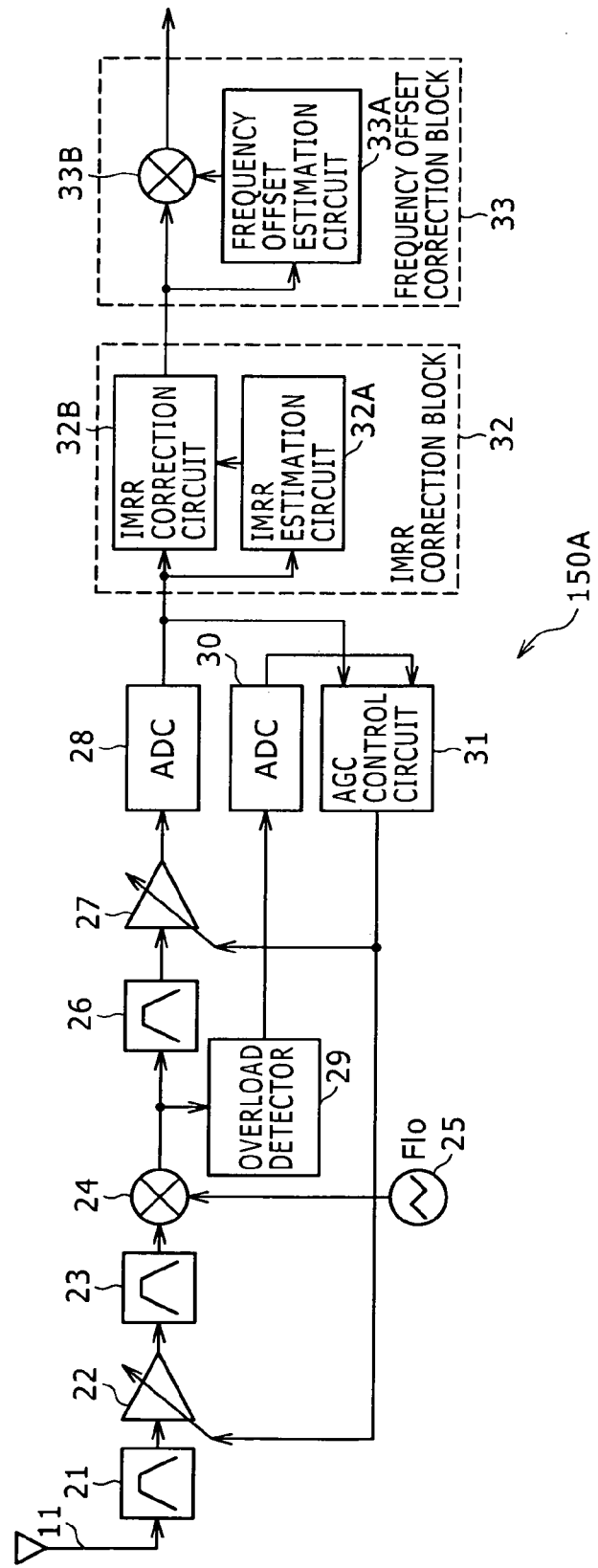
FIG. 2 is a block diagram showing a first structure example of an ordinary tuner.

FIG. 2 shows the first structure example of the ordinary tuner.

In a tuner 150A of FIG. 2, the broadcast signals of a terrestrial digital broadcast are received by an antenna 11 and input to an RF filter 21. The RF filter 21 allows only the terrestrial digital broadcast signals to pass through. The signals past the RF filter 21 are amplified by a variable gain RF amplifier 22 by the gain corresponding to the reception frequency. The amplified signals are forwarded to an RF filter 23.

Given the signals amplified by the variable gain RF amplifier 22, the RF filter 23 allows only the signal at the reception frequency to pass through. The signal past the RF filter 23 is sent to a mixer 24. The mixer 24 mixes the output signal from the RF filter 23 with a signal at a local frequency Flo coming from a local oscillation circuit 25 to obtain an IF signal. The resulting IF signal is fed to a channel selection filter 26 and an overload detector 29.

The channel selection filter 26 removes interference signals at frequencies adjacent to the intermediate frequency to leave out the IF signal. A variable gain IF amplifier 27 amplifies the left-out IF signal by a predetermined gain and outputs the amplified signal to an ADC (AD converter) 28. The ADC 28 converts the analog IF signal fed from the variable gain IF amplifier 27 into digital form (A/D conversion) and outputs the digitized signal to an AGC control circuit 31 and an IMRR correction block 32.

The overload detector 29 compares the IF signal with a predetermined threshold value, detects signal components exceeding the threshold value, and feeds the result of the detection to an ADC 30 for use in the AGC loop. The ADC 30 converts the IF signal level as the result of the detection by the overload detector 29 into digital form (A/D conversion) and outputs the digitized IF signal level to the AGC control circuit 31.

The AGC control circuit 31 controls the gains of the variable gain RF amplifier 22 and the variable gain IF amplifier 27 based on the digital value of the IF signal output from the ADC 28 and on the digital value of the IF signal level from the ADC 30.

The IMRR correction block 32 performs IMRR (image rejection ratio) correction. An IMRR estimation circuit 32A estimates an IMRR correction value, and an IMRR correction circuit 32B carries out IMRR correction based on the IMRR correction value. The IF signal having undergone the IMRR correction is output to a frequency offset correction block 33.

The frequency offset correction block 33 corrects the offset of the IF signal frequency. A frequency offset estimation circuit 33A estimates a correction value of the IF signal frequency offset and outputs the signal corresponding to the estimated correction value to a mixer 33B. The mixer 33B mixes the IF signal having undergone the IMRR correction with the correction signal output from the frequency offset estimation circuit 33A, outputting the IF signal having undergone the frequency offset correction.

In the tuner 150A structured as described above, there is no AGC loop formed solely by analog circuitry. It should be noted that IMRR correction and frequency offset correction are both carried out in the digital domain. That is, IMRR correction and frequency offset correction are both effected using the IF signal having undergone the A/D conversion.

[Second Structure Example of the Ordinary Tuner]

Figure 3:
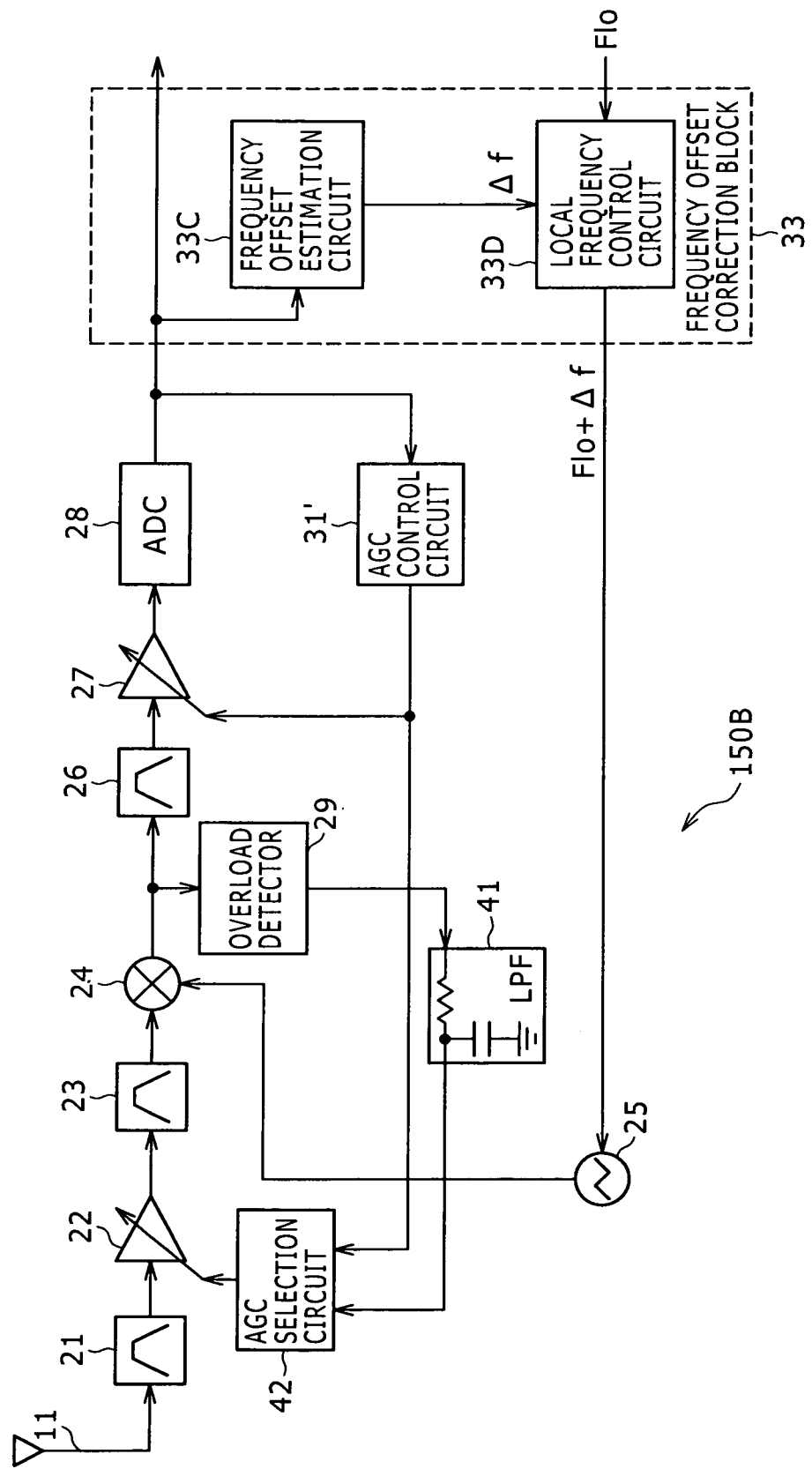
FIG. 3 is a block diagram showing a second structure example of the ordinary tuner.

FIG. 3 shows the second structure example of the ordinary tuner. In FIG. 3 and subsequent figures, the components corresponding to those already shown in FIG. 2 are designated by like reference numerals, and their explanations may be omitted where appropriate in the ensuing description.

In a tuner 150B of FIG. 3, the IF signal output from an ADC 28 is output to an AGC control circuit 31' and a frequency offset correction block 33. The frequency offset correction block 33 is made up of a frequency offset estimation circuit 33C and a local frequency control circuit 33D.

The frequency offset estimation circuit 33C estimates (i.e., calculates) a frequency offset correction value .f from the IF signal output from the ADC 28 and feeds the estimated value to the local frequency control circuit 33D. The local frequency control circuit 33D acquires information about a local frequency Flo and outputs to a local oscillation circuit 25 a corrected local frequency Flo+.f obtained by correcting the local frequency Flo using the correction value .f, the corrected local frequency Flo+.f constituting the local frequency to be set.

The AGC control circuit 31' determines the control value (set value) of the gain based on the digital value of the IF signal output from the ADC 28. The control value thus determined is output to a variable gain IF amplifier 27 and an AGC selection circuit 42.

A loop filter (LPF) 41 determines the gain control value (set value) for a variable gain RF amplifier 22 based on the output signal from an overload detector 29. The gain control value thus determined is output to the AGC selection circuit 42.

Given the gain control values (set values) from the AGC control circuit 31' and LPF 41, the AGC selection circuit 42 selects the lower gain control value of the two and feeds the selected control value to the variable gain RF amplifier 22.

In the tuner 150B structured as described above, there exists an AGC loop of analog signals passing through the overload detector 29, LPF 41, etc. That is, the tuner 150B contains an AGC loop formed solely by analog circuitry. Furthermore, frequency offset correction is performed in the analog domain and IMRR correction is carried out in the digital domain.

The broadcast signal received by the reception apparatus 1 is typically transmitted at a frequency being changed at intervals of a very short time period (e.g., 0.1 second or thereabout). Accordingly, it may become necessary to tune in to the desired reception frequency in a very short time (e.g., within 5 milliseconds).

However, with the ordinary tuner structured as shown in FIGS. 2 and 3, it takes time to calculate the IMRR correction value and frequency offset correction value. Correspondingly, it takes time for the AGC control value to settle on an appropriate value. This typically makes it difficult to tune in to the desired reception frequency in a time period as short as 5 milliseconds.

Given the disadvantages indicated or implied above, the tuners 150A and 150B in FIGS. 2 and 3 were improved in a manner capable of tuning in to the desired reception frequency in a very short time. The improvements have led to the tuner 12 of FIG. 1, which will be explained below.

<3. First Embodiment of the Tuner Used in the Reception Apparatus of the Present Disclosure>

[First Embodiment of the Tuner 12]

Figure 4:
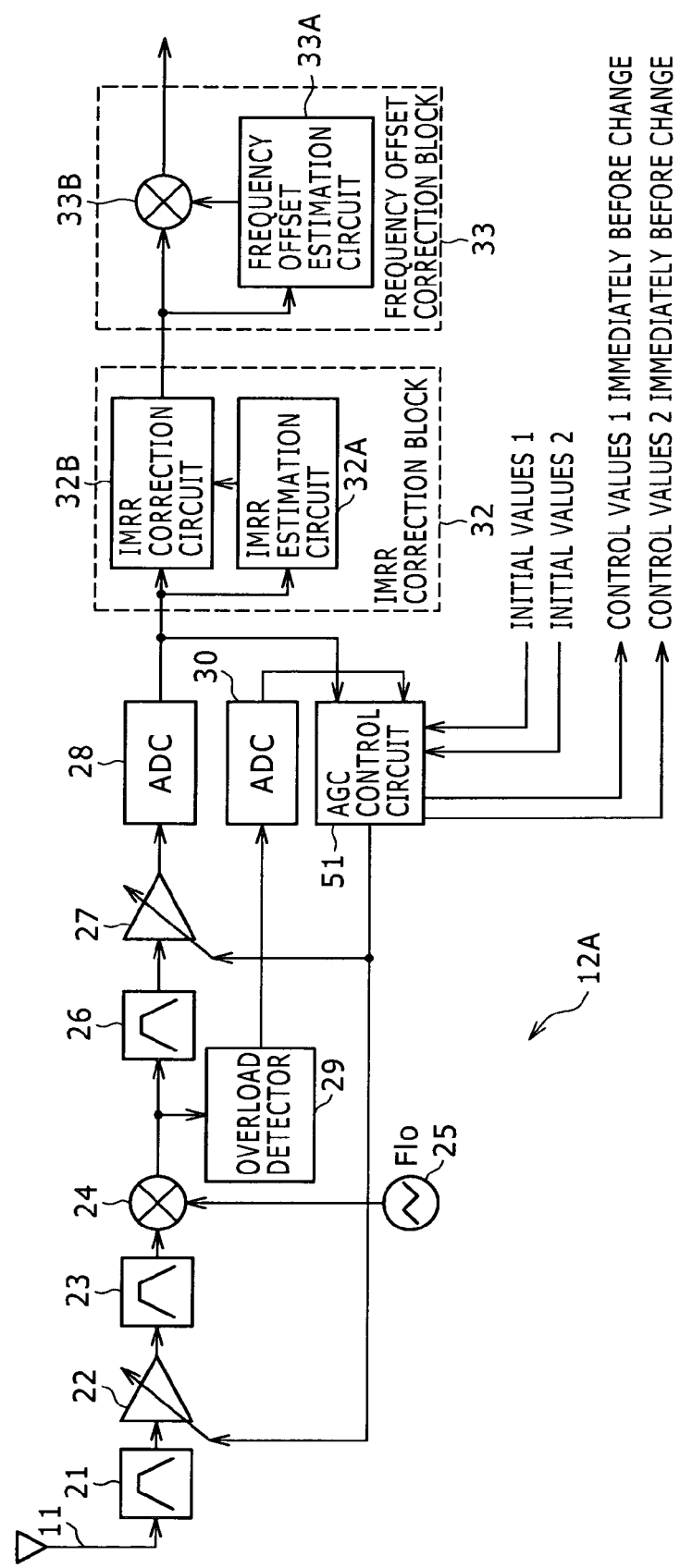
FIG. 4 is a block diagram showing a typical structure of a first embodiment of a tuner.

FIG. 4 is a block diagram showing a typical structure of a tuner 12A constituting the first embodiment of the tuner 12.

The tuner 12A in FIG. 4 is an improvement over the tuner 150A shown in FIG. 2 and having no AGC loop formed solely by analog circuitry.

More specifically, the tuner 12A has an AGC control circuit 51 replacing the AGC control circuit 31 of the tuner 150A.

Upon change of the tuner 12A to a new reception frequency, the AGC control circuit 51 supplies the control circuit 14 (FIG. 1) with control values 1 and 2 in effect immediately before the change. At the same time, the AGC control circuit 51 acquires from the control circuit 14 the last control values 1 and 2 of the reception frequency to change to as initial values 1 and 2, and sets the initial values 1 and 2 inside.

Figure 5:
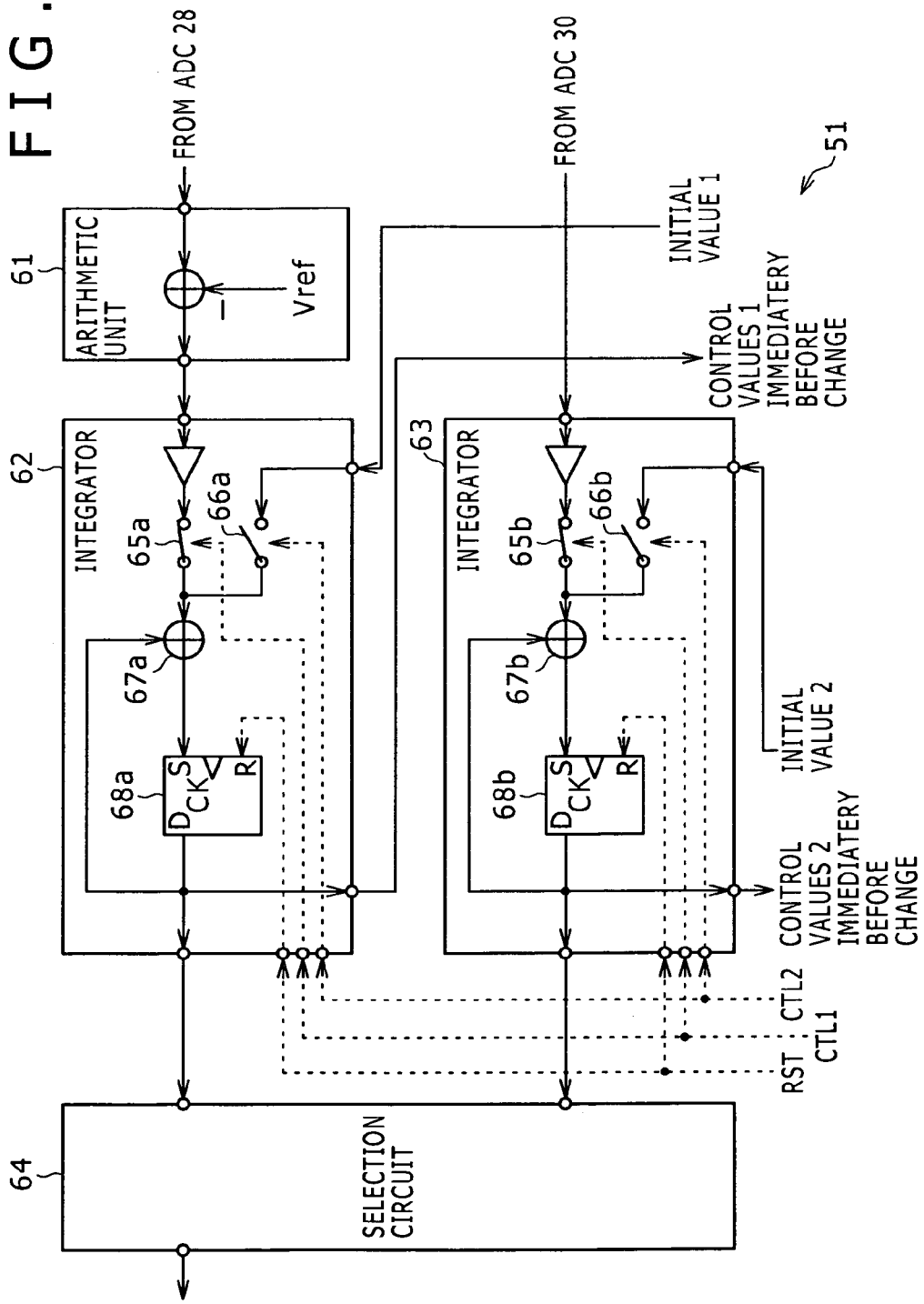
FIG. 5 is a block diagram showing a detailed typical structure of an AGC control circuit.

FIG. 5 is a block diagram showing a detailed typical structure of the AGC control circuit 51.

The AGC control circuit 51 is made up of an arithmetic unit 61, integrators 62 and 63, and a selection circuit 64.

The digital value of the IF signal output from the ADC 28 is input to the arithmetic unit 61. The arithmetic unit 61 subtracts a reference signal Vref from the input digital value and outputs the resulting signal. The signal output from the arithmetic unit 61 is input to the integrator 62. The integrator 62 calculates and outputs the control value 1. Meanwhile, the signal output from the ADC 30 is input to the integrator 63. The integrator 63 calculates and outputs the control value 2. The control values 1 and 2 are input to the selection circuit 64.

Given the control values 1 and 2, the selection circuit 64 selects the lower gain control value of the two and outputs the selected value.

Switches 65a and 65b are turned on or off by a control signal CTL1 coming from the control circuit 14 (FIG. 1). Switches 66a and 66b are turned on or off by a control signal CTL2 also coming from the control circuit 14.

A register 68a outputs a signal added up with a feedback signal by an adder 67a while temporarily retaining the added-up signal. The output of the register 68a is sent in a suitably timed manner to the control circuit 14 (FIG. 1) as the control value 1 in effect immediately before the change. A register 68b also outputs a signal added up with a feedback signal by an adder 67b while temporarily retaining the added-up signal. The output of the register 68b is sent in a suitably timed manner to the control circuit 14 (FIG. 1) as the control value 2 in effect immediately before the change. The signals (control values) held temporarily in the registers 68a and 68b are reset by a reset signal RST coming from the control circuit 14 (FIG. 1).

[AGC Control Process Performed Upon Reception Frequency Change]

Figure 6:
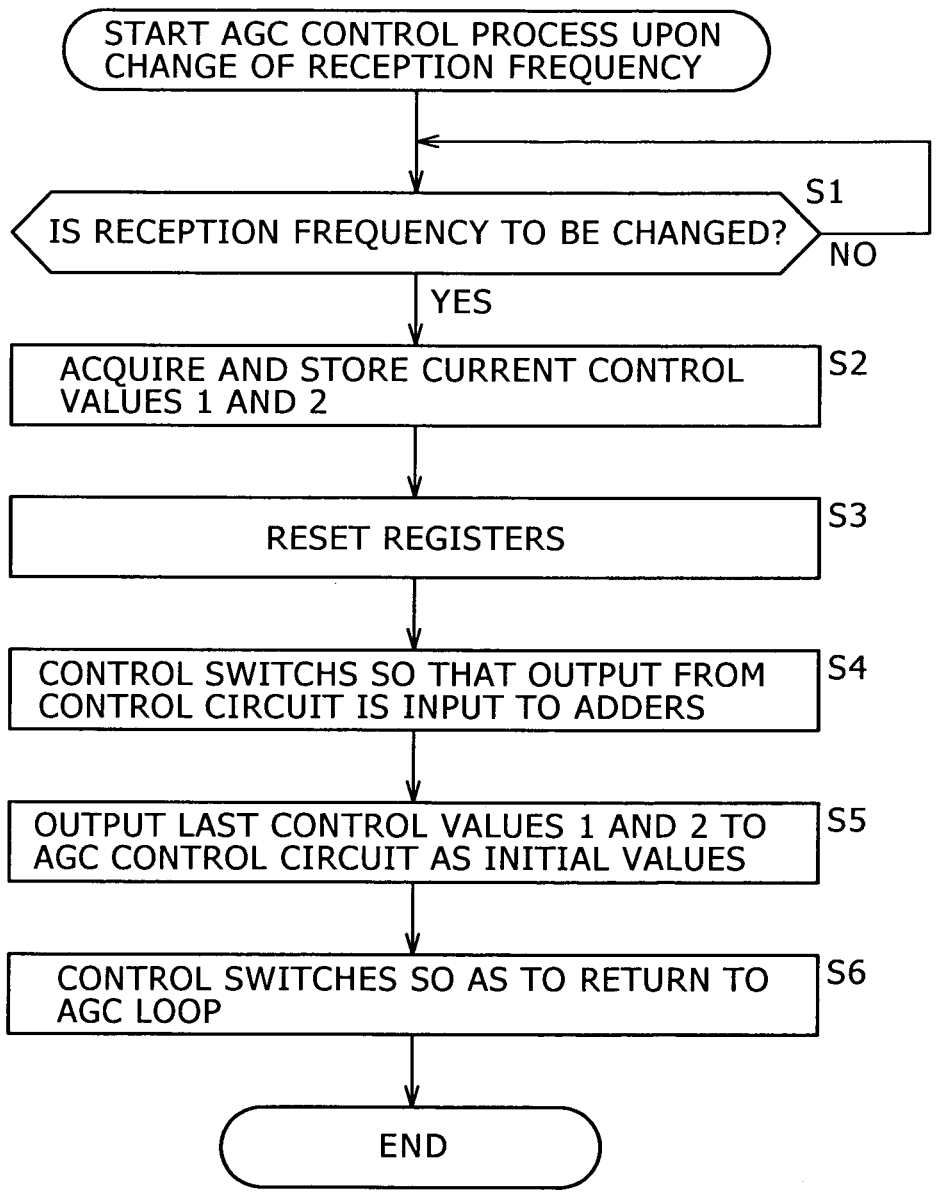
FIG. 6 is a flowchart explanatory of an AGC control process performed upon reception frequency change.

FIG. 6 is a flowchart explanatory of an AGC control process performed upon reception frequency change by the first embodiment of the tuner 12. At the start of this process, the switches 65a and 65b are held on and the switches 66a and 66b are held off.

In step S1, the control circuit 14 (FIG. 1) first determines whether or not the reception frequency is to be changed. The control circuit 14 waits until the reception frequency is determined to be changed.

If it is determined in step S1 that the reception frequency is to be changed, control is passed on to step S2. In step S2, the control circuit 14 acquires from the tuner 12A the output values of the registers 68a and 68b in the AGC control circuit 51 as the current AGC control values 1 and 2, and stores the acquired values.

In step S3, the control circuit 14 feeds the reset signal RST to the registers 68a and 68b in the AGC control circuit 51, thereby resetting the values retained in the registers 68a and 68b.

In step S4, the control circuit 14 controls the switches in such a manner that the output of the control circuit 14 itself is input to the adders. More specifically, the control circuit 14 supplies the AGC control circuit 51 with a control signal CTL1 for turning off the switches 65a and 65b and a control signal CTL2 for turning on the switches 66a and 66b. This causes the input to the adders 67a and 67b to come not from the ADC 28 but from the control circuit 14.

In step S5, the control circuit 14 outputs to the AGC control circuit 51 the last control values 1 and 2 of the reception frequency about to be changed, the control values 1 and 2 constituting the initial values. Following the above-described step S4, the input to the adders 67a and 67b is arranged to come from the control circuit 14. Thus the last control values 1 and 2 output from the control circuit 14 are sent to, and retained by, the registers 68a and 68b.

In step S6, the control circuit 14 controls the switches so as to return to the AGC loop. That is, the control circuit 14 supplies the AGC control circuit 51 with the control signal CTL1 for turning on the switches 65a and 65b and the control signal CTL2 for turning off the switches 66a and 66b. This causes the input to the adders 67a and 67b to come from the ADC 28 and ADC 30, whereby control of the AGC loop is resumed. As a result, the tuner 12A performs AGC control using the last AGC control values 1 and 2 as the initial values.

As described, when the reception frequency is changed by the tuner 12A during the AGC control process, the control values (AGC gain values) in effect immediately before the change are stored preparatory to tuning in subsequently to the same reception frequency. At the next tuning time, AGC control is started using the last control values as the initial values. This makes it possible to tune in rapidly to the desired reception frequency.

<4. Variation of the First Embodiment of the Tuner>

[Variation of the Tuner 12A]

The above-described tuner 12A was shown storing the AGC gain values in effect immediately before the frequency change preparatory to tuning in subsequently to the same reception frequency. Preferably, an IMRR correction value and a frequency offset correction value may be stored in like manner.

Figure 7:
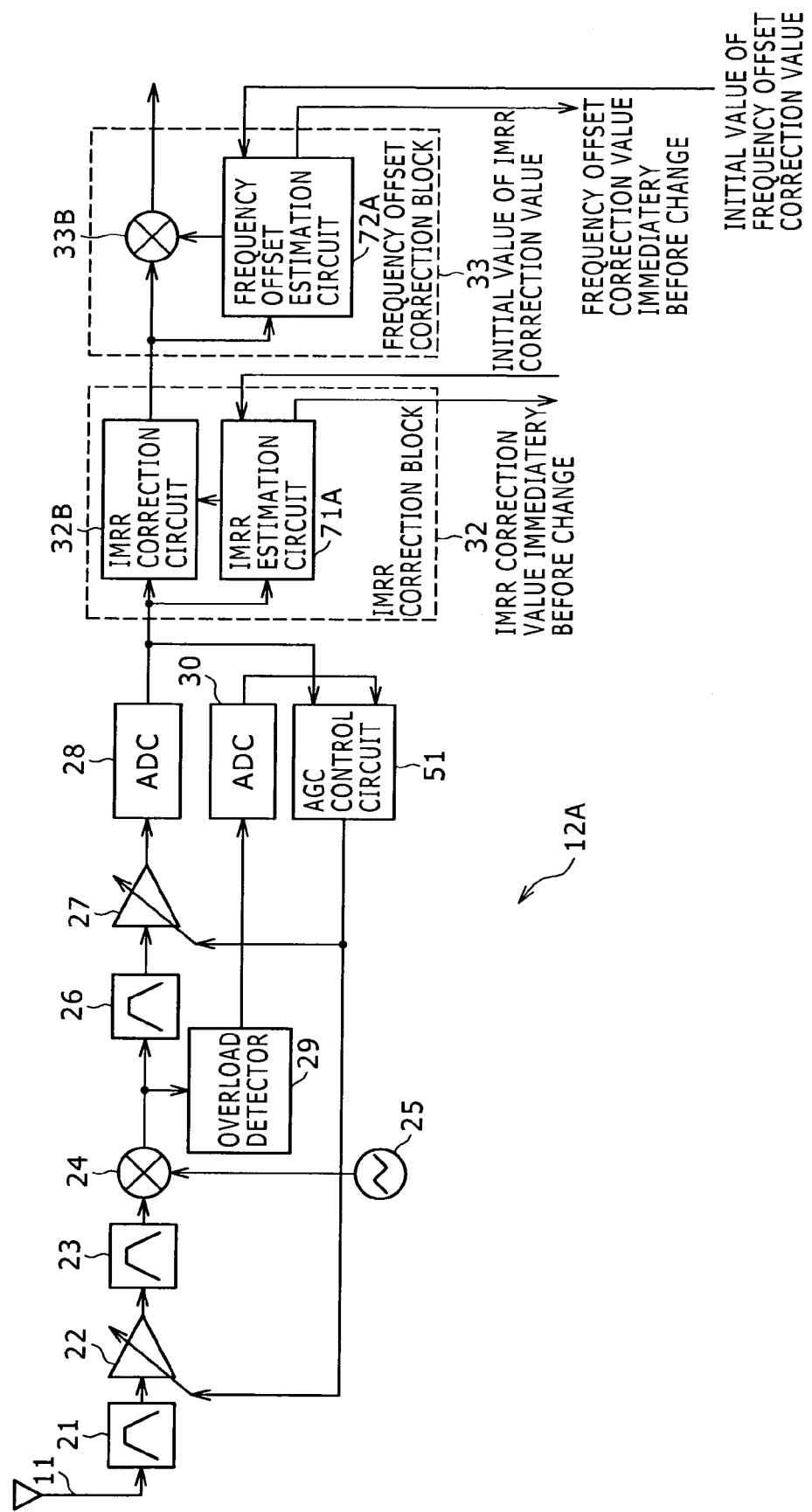
FIG. 7 is a block diagram showing a variation of the first embodiment of the tuner in FIG. 4.

FIG. 7 is a block diagram showing a typical structure of a tuner 12A arranged to retain the IMRR correction value and frequency offset correction value.

In FIG. 7, an IMRR estimation circuit 71A is provided to replace the IMRR estimation circuit 32A of FIG. 4, and a frequency offset estimation circuit 72A is furnished to replace the frequency offset estimation circuit 33A of FIG. 4.

At the same time as step S2 in FIG. 6 is carried out, the IMRR estimation circuit 71A outputs the current IMRR correction value to the control circuit 14 as the IMRR correction value in effect immediately before the frequency change. The control circuit 14 acquires from the IMRR estimation circuit 71A the IMRR correction value in effect immediately before the change as the last control value, and stores the acquired value.

Then at the same time as step S5 in FIG. 6 is carried out, the IMRR estimation circuit 71A acquires from the control circuit 14 the last IMRR correction value as the initial value of the reception frequency to change to. The IMRR estimation circuit 71A proceeds to output the last IMRR correction value acquired as the initial value to the IMRR correction circuit 32B.

Simultaneously with the execution of step S2 in FIG. 6, the frequency offset estimation circuit 72A outputs to the control circuit 14 the current frequency offset correction value as the frequency offset correction in effect immediately before the frequency change. The control circuit 14 acquires from the frequency offset estimation circuit 72A the frequency offset correction value in effect immediately before the frequency change as the last control value, and stores the acquired value.

Then simultaneously with the execution of step S5 in FIG. 6, the frequency offset estimation circuit 72A acquires from the control circuit 14 the last frequency offset correction value as the initial value of the reception frequency to change to. The frequency offset estimation circuit 72A proceeds to output to the mixer 33B a signal representative of the last frequency offset correction value acquired as the initial value.

Where the tuner 12A of FIG. 7 is in use, it is possible rapidly to attain the same characteristics as those of the last IMRR correction and frequency offset correction.

<5. Second Embodiment of the Tuner Used in the Reception Apparatus of the Present Disclosure>

[Second Embodiment of the Tuner 12]

Figure 8:
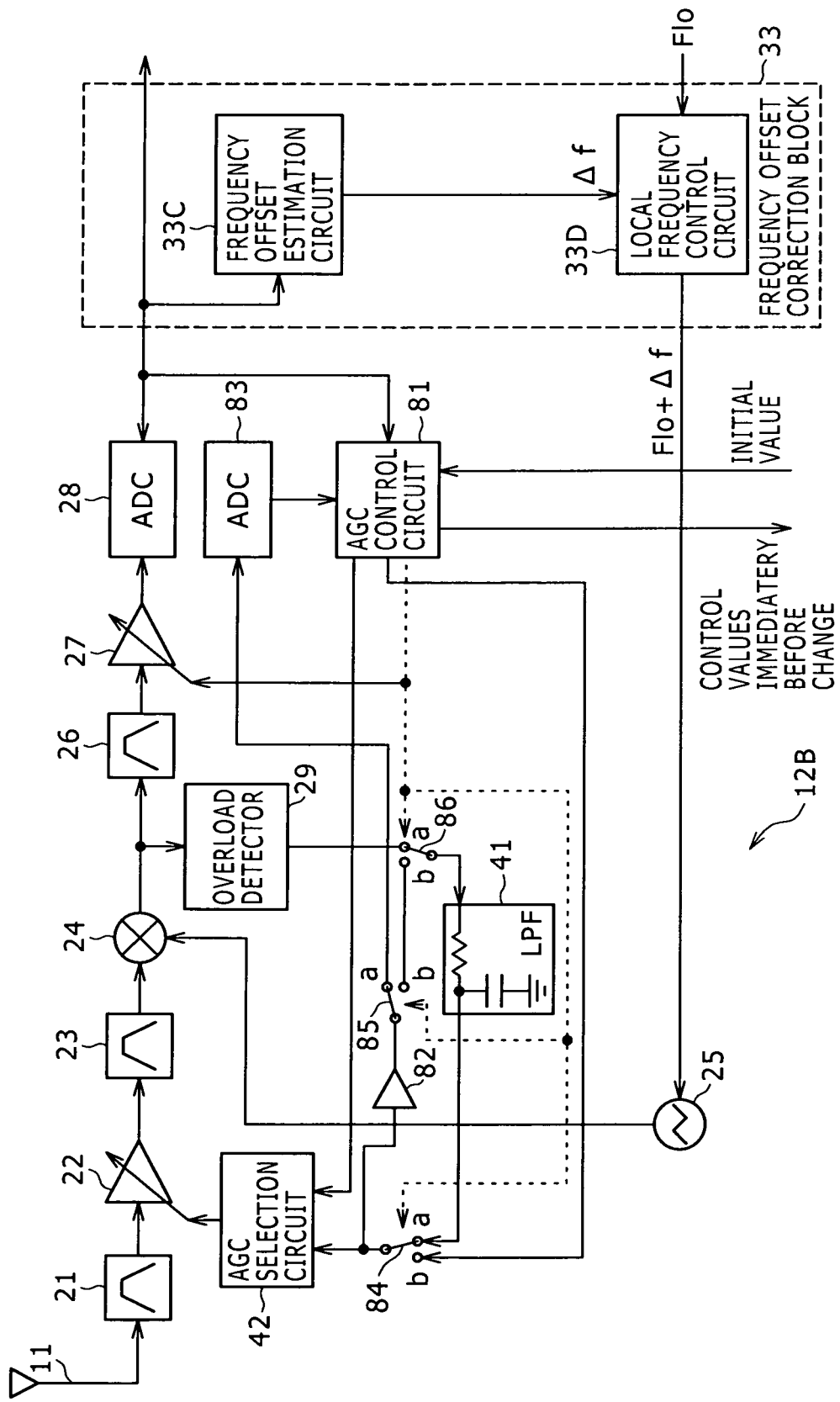
FIG. 8 is a block diagram showing a variation of the second embodiment of the tuner in FIG. 1.

FIG. 8 is a block diagram showing a typical structure of a tuner 12B practiced as the second embodiment of the tuner 12.

The tuner 12B in FIG. 8 is an improvement over the tuner 150B in FIG. 3 in which there exists the AGC loop formed solely by analog circuitry.

Compared with the tuner 150B in FIG. 3, the tuner 12B in FIG. 8 has an AGC control circuit 81 replacing the AGC control circuit 31' and newly includes a buffer 82, an ADC 83, and switches 84 through 86.

When the reception frequency of the tuner 12B is to be changed, the AGC control circuit 81 feeds the control values in effect immediately before the change to the control circuit 14 (FIG. 1). At the same time, the AGC control circuit 81 acquires from the control circuit 14 the last control values of the reception frequency to change to, and sets the acquired values as the initial values.

Also, the AGC control circuit 81 controls the switches 84 through 86 in accordance with the acquisition and output of the control values.

Where the reception frequency is not to be changed, i.e., in the ordinary state in which gain control is performed based on the IF signal output from the ADC 28, the switches 84 through 86 are all set to the "a" side by the AGC control circuit 81. In this case, the output signal from the overload detector 29 is input to the AGC selection circuit 42 via the LPF 41, so that the same gain control as that of the tuner 150B in FIG. 3 is carried out.

The control voltage for the AGC loop of analog circuitry (called the analog AGC loop hereunder where appropriate) is input to the ADC 83 via the buffer 82. The ADC 83 converts the control voltage from analog to digital form before forwarding the voltage to the AGC control circuit 81. In the ordinary state, however, the AGC control circuit 81 does not perform any specific process.

[AGC Control Process Performed Upon Reception Frequency Change]

Explained below in reference to FIGS. 9 through 12 is a typical AGC control process carried out upon reception frequency change by the second embodiment of the tuner 12.

Figure 9:
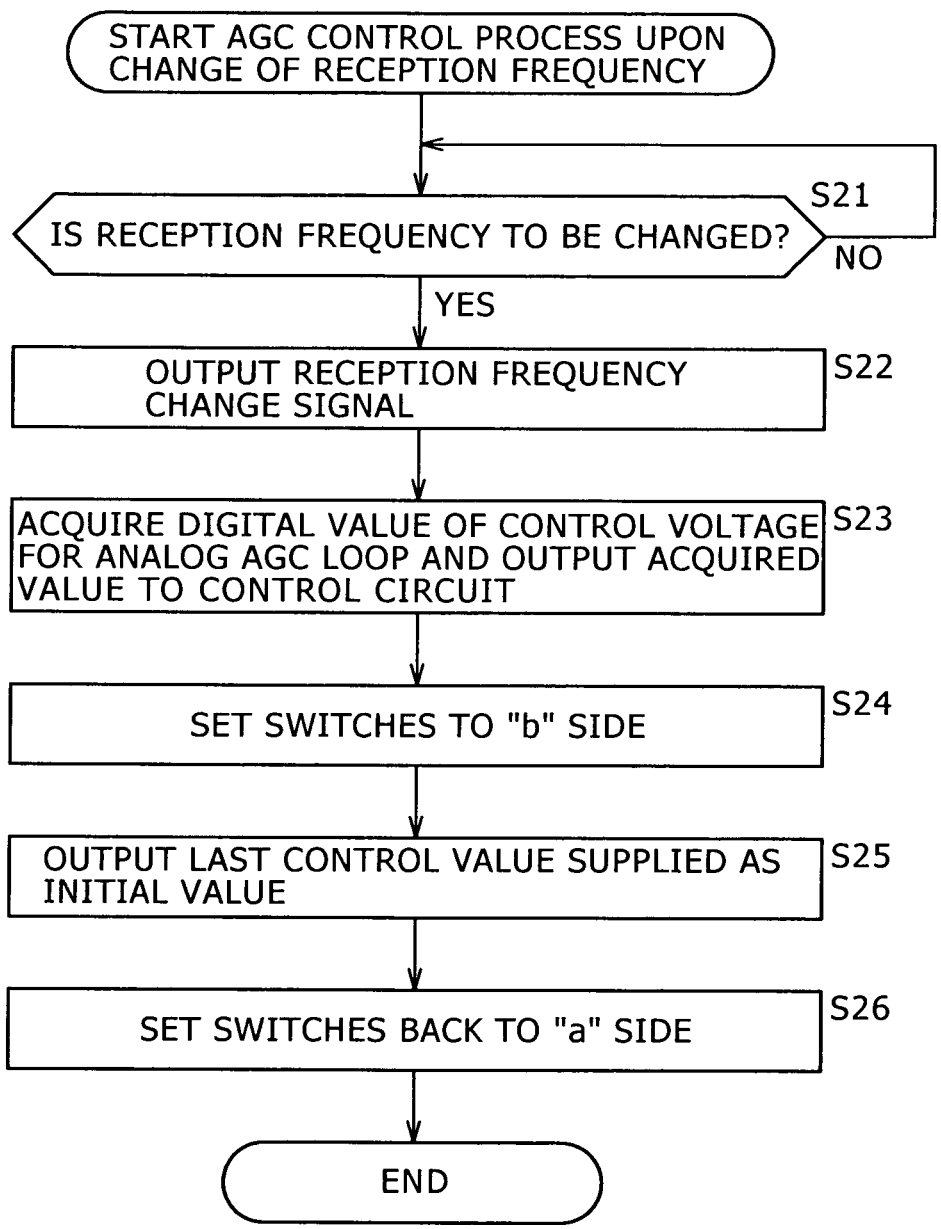
FIG. 9 is a flowchart explanatory of another AGC control process performed upon reception frequency change.
Figure 10:
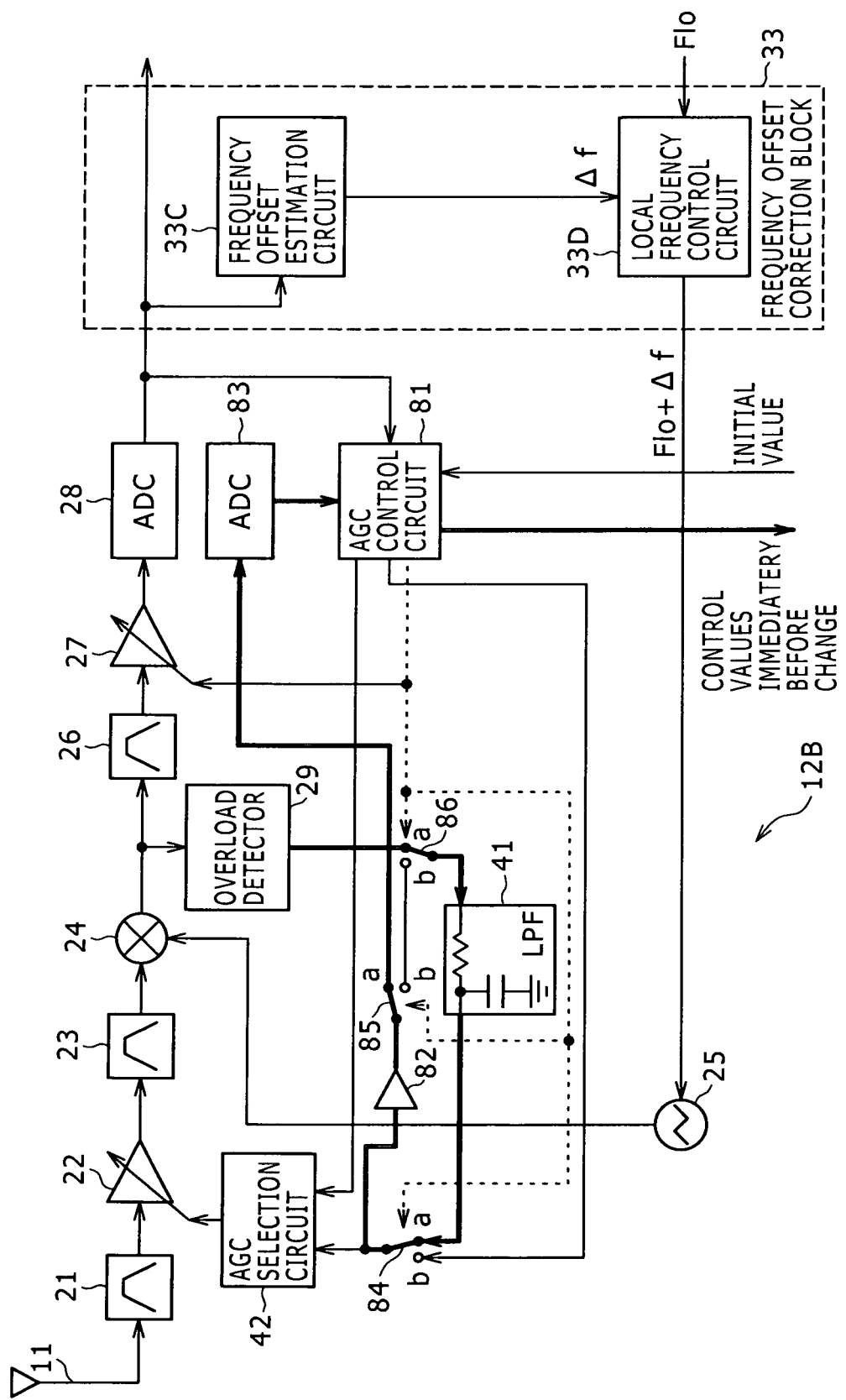
FIG. 10 is a block diagram explanatory of the AGC control process performed upon reception frequency change.

FIG. 9 is a flowchart explanatory of the AGC control process performed upon reception frequency change by the tuner 12B in FIG. 8. At the start of this process, it is assumed that the tuner 12B is in the ordinary state in which gain control is performed based on the IF signal output from the ADC 28 and that the switches 84 through 86 are all set to the "a" side.

In step S21, the control circuit 14 (FIG. 1) first determines whether or not the reception frequency is to be changed. The control circuit 14 waits until the reception frequency is determined to be changed.

If it is determined in step S21 that the reception frequency is to be changed, control is passed on to step S22. In step S22, the control circuit 14 outputs a reception frequency change signal to the AGC control circuit 81 of the tuner 12B.

Given the reception frequency change signal from the control circuit 14, the AGC control circuit 81 of the tuner 12B in step S23 acquires from the ADC 83 the digital value of the control voltage for the analog AGC loop, the value having been input to the ADC 83 via the buffer 82. The AGC control circuit 81 proceeds to output to the control circuit 14 the acquired digital value of the control voltage for the analog AGC loop as the last control value in effect immediately before the frequency change. The control circuit 14 acquires the control value immediately before the frequency change from the AGC control circuit 81 of the tuner 12B, and stores the acquired control value.

Figure 11:
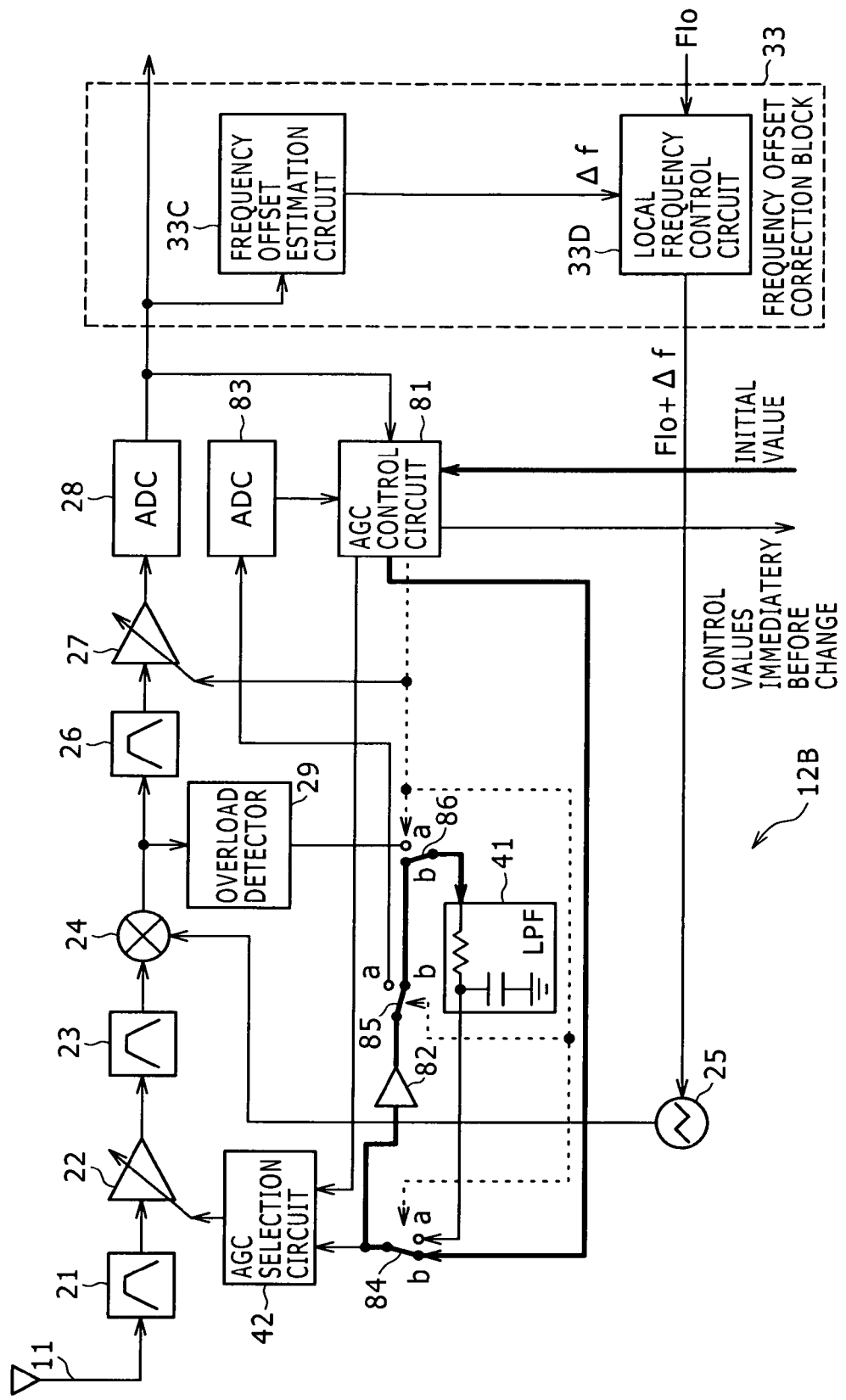
FIG. 11 is a block diagram explanatory of the AGC control process performed upon reception frequency change.

Next in step S24, the AGC control circuit 81 sets the switches 84 through 86 to the "b" side as shown in FIG. 11. These settings turn off control of the analog AGC loop.

In step S25, the control circuit 15 outputs to the AGC control circuit 81 the last control value of the reception frequency to change to as the initial value. Given the last control value as the initial value from the control circuit 14, the AGC control circuit 81 outputs the received value to the switch 84. As a result, as shown in FIG. 11, the last control value as the initial value is fed directly (i.e., set) to the AGC selection circuit 84 as the first control voltage for the analog AGC loop. Also, the last control value is supplied to the LPF 41 via the buffer 82. The LPF 41 is charged with voltage until the voltage of the LPF 41 reaches a predetermined range regarded the same as the voltage fed directly to the AGC selection circuit 42 as the initial value. That is, the LPF is charged with voltage until the voltage of the LPF 41 reaches a predetermined range regarded the same as that of the last AGC control time.

Upon elapse of a predetermined time period after the LPF 41 has started to be charged, the charged voltage of the LPF 41 is considered to have reached the same level as that of the last AGC control time. Control is then passed on to step S26.

Figure 12:
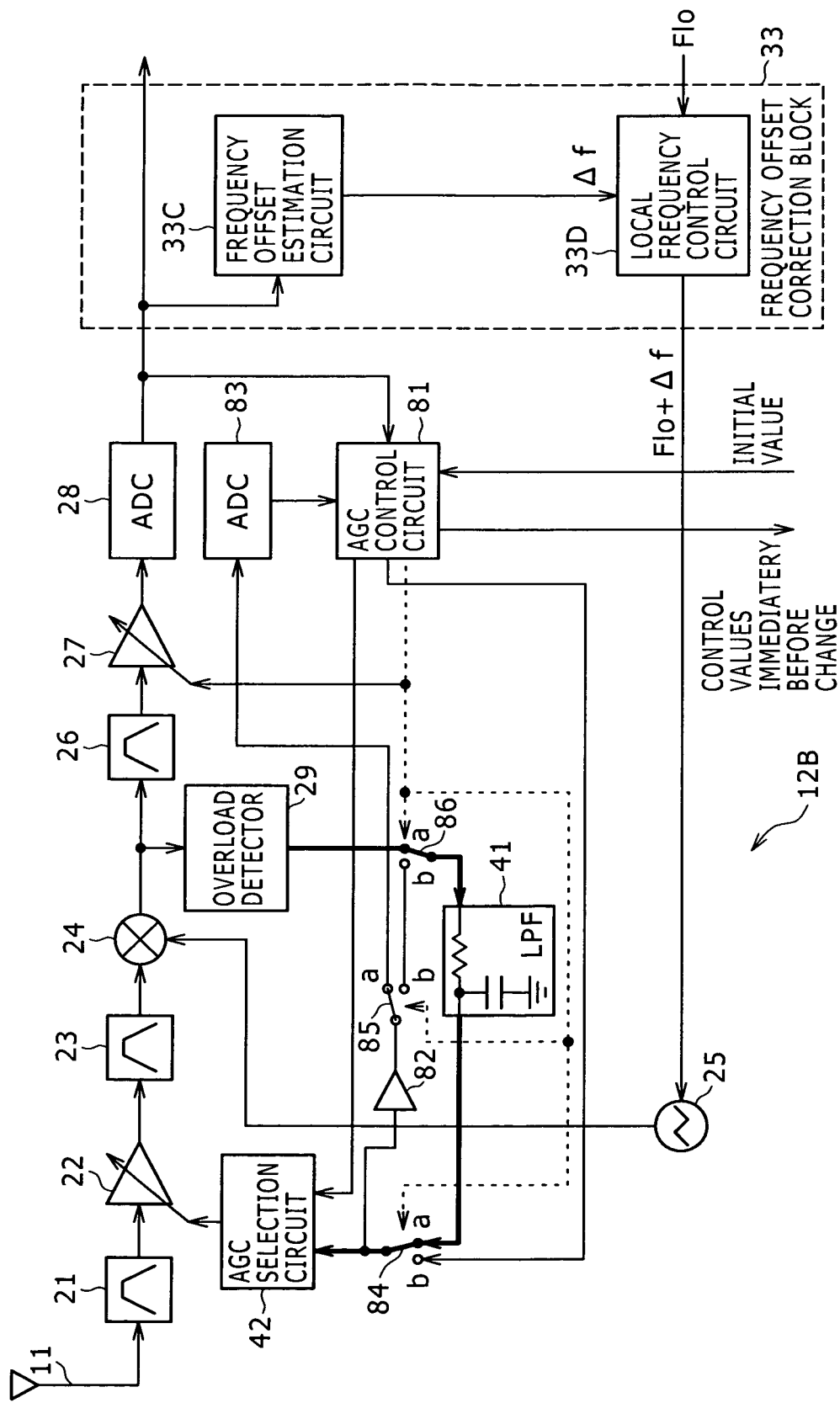
FIG. 12 is a block diagram explanatory of the AGC control process performed upon reception frequency change.

In step S26, the AGC control circuit 81 sets the switches 84 through 86 back to the "a" side as shown in FIG. 12, and terminates the process. This enables AGC loop control to be started using the last control voltage for the analog AGC loop as the initial value.

As described, when the reception frequency is changed during the AGC control process by the tuner 12B, the control value (i.e., control voltage for controlling the AGC loop gain) in effect immediately before the change is stored preparatory to tuning in subsequently to the same reception frequency. At the next tuning time, AGC loop control is started using the last control value as the initial value. This makes it possible to tune in rapidly to the desired reception frequency.

<6. Variations of the Second Embodiment of the Tuner>

[First Variation of the Tuner 12B]

The above-described tuner 12B was shown storing the control voltage in effect immediately before the frequency change preparatory to tuning in subsequently to the same reception frequency. Preferably, the tuner 12B may be arranged to store a frequency offset correction value as the last control value as well.

Figure 13:
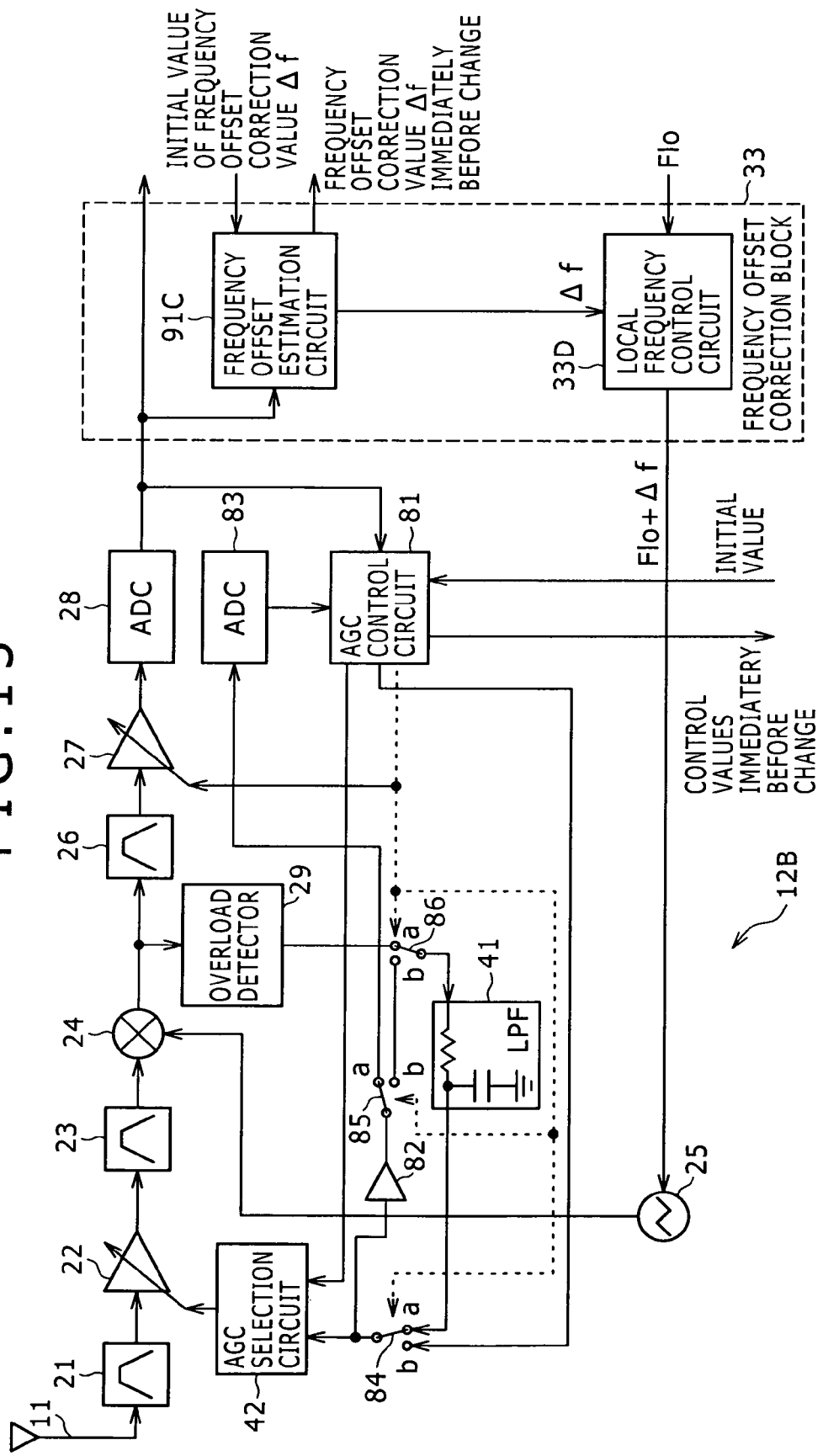
FIG. 13 is a block diagram showing a first variation of the second embodiment of the tuner.

FIG. 13 is a block diagram showing a typical structure of a tuner 12B arranged additionally to store the frequency offset correction value.

In FIG. 13, a frequency offset estimation circuit 91C is provided to replace the frequency offset estimation circuit 33C in FIG. 8.

At the same time as step S23 in FIG. 9 is carried out, the frequency offset estimation circuit 91C outputs to the control circuit 14 the current frequency offset correction value .f as the frequency offset correction value .f in effect immediately before the frequency change. The control circuit 14 acquires the frequency offset correction value .f immediately before the frequency change from the frequency offset estimation circuit 91C, and stores the acquired value.

Then at the same time as step S25 in FIG. 9 is carried out, the control circuit 14 outputs to the frequency offset estimation circuit 91C the last frequency offset correction value .f of the reception frequency to change to as the initial value. The frequency offset estimation circuit 91C acquires from the control circuit 14 the last frequency offset correction value .f as the initial value. And the frequency offset estimation circuit 91C outputs the frequency offset correction value .f acquired as the initial value to the local frequency control circuit 33D.

[Second Variation of the Tuner 12B]

Figure 14:
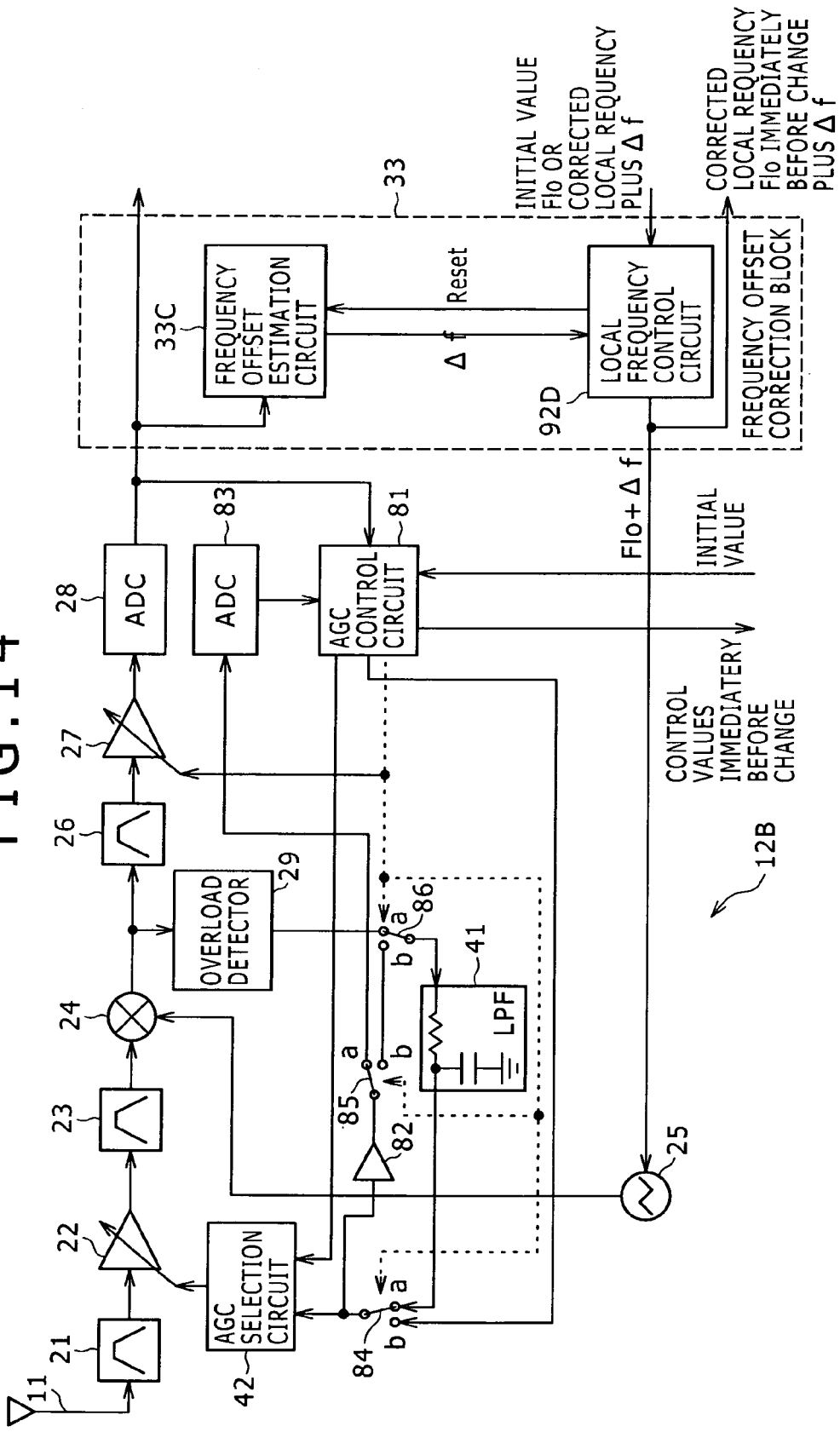
FIG. 14 is a block diagram showing a second variation of the second embodiment of the tuner.

FIG. 14 is a block diagram showing a typical structure of a tuner 12B arranged to store a local frequency Flo+.f having undergone frequency offset correction.

In FIG. 14, a local frequency control circuit 92D is provided to replace the local frequency control circuit 33D in FIG. 8.

Simultaneously with the execution of step S23 in FIG. 9, the local frequency control circuit 92D outputs to the control circuit 14 the currently corrected local frequency (corrected local frequency) Flo+.f as the corrected local frequency Flo+ .f in effect immediately before the frequency change. The control circuit 14 acquires the corrected local frequency Flo+ .f immediately before the frequency change from the local frequency control circuit 92D, and stores the acquired local frequency.

Then simultaneously with the execution of step S25 in FIG. 9, the control circuit 14 outputs to the local frequency control circuit 92D the lastly corrected local frequency Flo+.f of the reception frequency to change to as the initial value. The local frequency control circuit 92D acquires the lastly corrected local frequency Flo+.f as the initial value from the control circuit 14. The local frequency control circuit 92D resets temporarily the correction value .f calculated by the frequency offset estimation circuit 33C, and outputs the corrected local frequency Flo+.f acquired as the initial value to the local oscillation circuit 25.

Where the tuner 12B of FIG. 13 or of FIG. 14 is in use, it is possible rapidly to attain the same characteristics as those of the last frequency offset correction.

<7. Another Embodiment of the Reception Apparatus of the Present Disclosure>

[Typical Structure of the Reception Apparatus]

Figure 15:
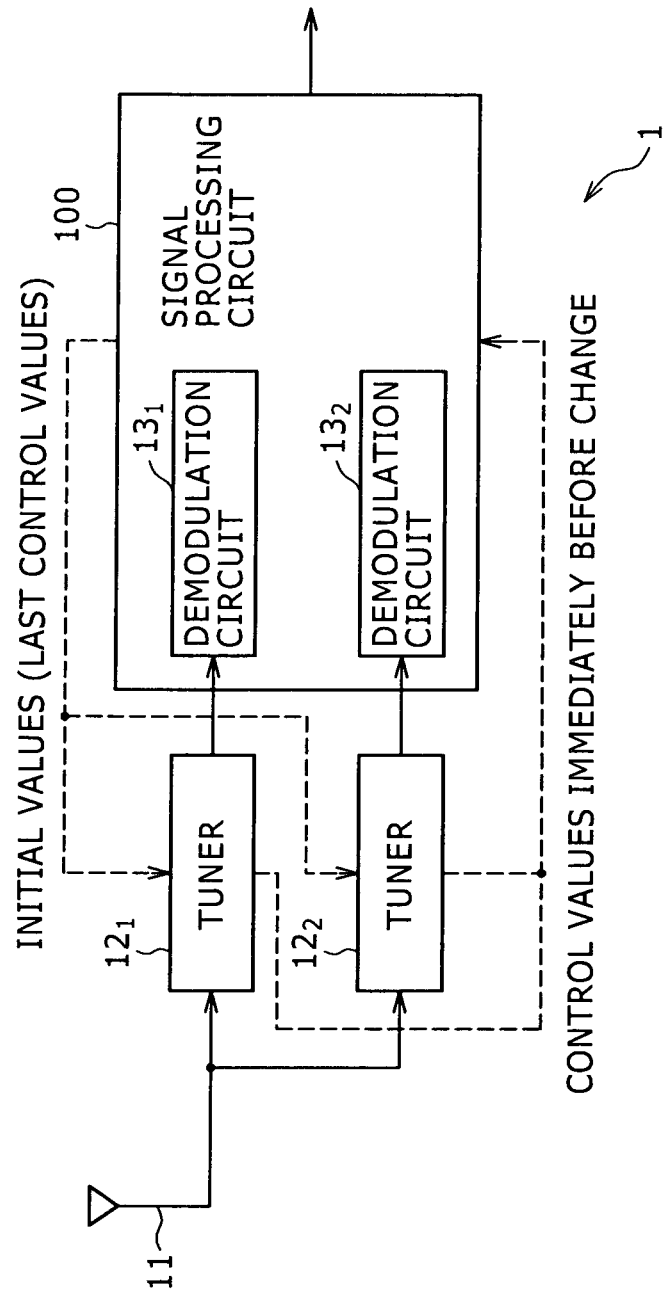
FIG. 15 is a block diagram showing a typical structure of another embodiment of the reception apparatus according to the present disclosure.

FIG. 15 is a block diagram showing a typical structure of another embodiment of the reception apparatus 1 according to the present disclosure.

In the reception apparatus 1 of FIG. 15, a signal processing circuit 100 is provided to replace the control circuit 14 in FIG. 1, with a demodulation circuit 13 incorporated in the signal processing circuit 100. That is, whereas the reception apparatus 1 in FIG. 1 has the demodulation circuit 13 and control circuit 14 structured as separate circuits, the reception apparatus 1 in FIG. 15 uses a single signal processing circuit 100 to implement the functions of the demodulation circuit 13 and control circuit 14.

In FIG. 1, the tuner 12, demodulation circuit 13, and control circuit 14 may each be composed of a separate IC (integrated circuit) chip. Obviously, the two tuners $12_1$ and $12_2$ may be formed by one IC chip, or the two demodulation circuits $13_1$ and $13_2$ by one IC chip. Also, the tuner $12_1$ and demodulation circuit $13_1$ may be constituted by one IC chip, or the tuner $12_2$ and demodulation circuit $13_2$ by one IC chip. In FIG. 15, a single IC chip may be used to constitute the signal processing circuit 100 that includes the functionality of the demodulation circuit 13.

<8. Embodiments of the Reception System to which the Reception Apparatus of the Present Disclosure May be Applied>

[First Configuration Example of the Reception System]

Figure 16:
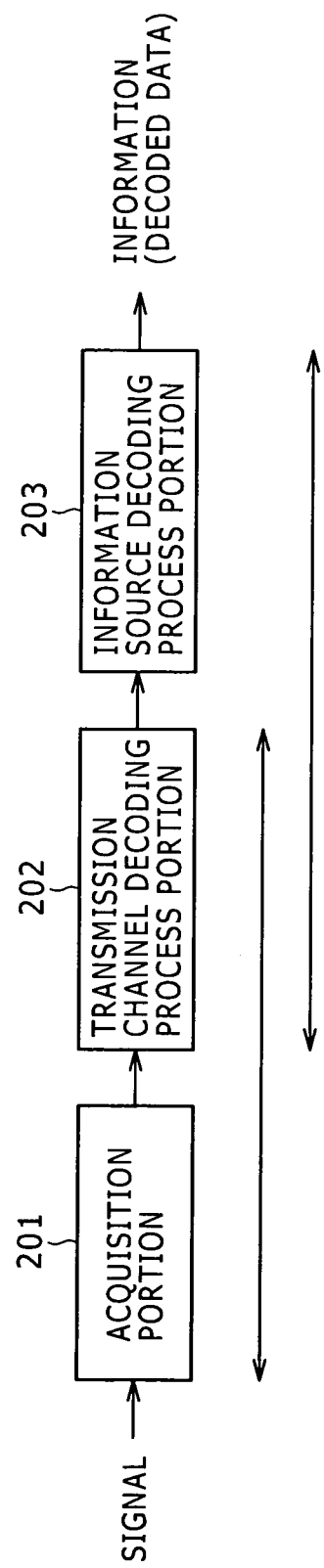
FIG. 16 is a block diagram showing a first configuration example of a reception system to which the reception apparatus of FIG. 1 may be applied.

FIG. 16 is a block diagram showing a first configuration example of a reception system to which the above-described reception apparatus 1 may be applied.

In FIG. 16, the reception system is made up of an acquisition portion 201, a transmission channel decoding process section 202, and an information source decoding process portion 203.

The acquisition portion 201 acquires a signal broadcast (i.e., transmitted) at a predetermined reception frequency over transmission channels (not shown) such as terrestrial digital broadcast, satellite digital broadcast, or CATV (cable television), and feeds the acquired signal to the transmission channel decoding process section 202. For example, the signal transmitted at the reception frequency may be a signal that includes video data and audio data making up TV programs.

The structure of the above-described reception apparatus 1 may be adopted as the acquisition portion 201.

Specifically, the reception apparatus 1 serving as the acquisition portion 201 includes a tuner 12 and a control circuit 14. The tuner 12 receives a signal at a frequency being changed at intervals of a predetermined time period. Before changing the frequency to receive the signal, the control circuit 14 stores control information about the tuner 12 receiving the signal at the current frequency as last control information. Upon receiving again the signal at the frequency in effect before the change, the control circuit 14 sets the last control information to the tuner 12 as the initial value.

The transmission channel decoding process portion 202 performs a transmission channel decoding process on the signal acquired by the acquisition portion 210 over the transmission channels, the decoding process including the process of correcting any error that may have occurred over the transmission channels. The transmission channel decoding process portion feeds the signal resulting from the transmission channel decoding process to the information source decoding process portion 203.

That is, the signal acquired by the acquisition portion 201 over the transmission channels is a signal having undergone error correction coding for correcting any error that may have occurred over the transmission channels. On that signal, the transmission channel decoding process section 202 carries out the transmission channel decoding process including error correction processing or the like. Variations of error correction coding include LDPC coding and Reed-Solomon coding.

The information source decoding process portion 203 performs an information source decoding process on the signal having undergone the transmission channel decoding process, the information source decoding processing including at least the process of expanding compressed information back to the original information.

That is, the signal acquired by the acquisition portion 201 over the transmission channels may have undergone compression coding whereby the video and audio data making up the information have been reduced in size. In such a case, the information source decoding process portion 203 carries out the information source decoding process on the signal having undergone the transmission channel decoding process, the information source decoding process being typically the process of expanding compressed information back to the original information (i.e., expansion process).

If the signal acquired by the acquisition portion 201 over the transmission channels has not undergone compression coding, the information source decoding process portion 203 does not perform the process of expanding compressed information back to the original information.

Variations of the expansion process include MPEG (Moving Picture Experts Group phase) decoding. The information source decoding process may include descrambling in addition to the expansion process.

In the reception system structured as described above, the acquisition portion 201 may acquire over the transmission channels the signal made up of video and audio data having undergone compression coding such as MPEG coding as well as error correction coding such as LDPC coding. The acquisition portion 201 feeds the signal thus acquired to the transmission channel decoding process portion 202.

The transmission channel decoding process portion 202 may, for example, carry out LDPC decoding as the transmission channel decoding process on the LDPC-coded signal from the acquisition portion 201. The signal resulting from the transmission channel decoding process is fed to the information source decoding process portion 203.

The information source decoding process portion 203 performs the information source decoding process such as MPEG decoding on the signal from the transmission channel decoding process portion 202. The images and/or sounds resulting from the process are then output from the information source decoding process portion 203.

The reception system of FIG. 16 described above may be applied to the TV tuner for receiving TV broadcasts as digital broadcasts, for example.

The acquisition portion 201, transmission channel decoding process portion 202, and information source decoding process portion 203 may each be implemented in the form of an independent device (hardware (IC (integrated circuit), etc.) or a software module).

At least two of the acquisition portion 201, transmission channel decoding process portion 202, and information source decoding process portion 203 may be constituted as a single set of independent equipment. Such a set of independent equipment may be formed by the combination of the acquisition portion 201 and transmission channel decoding process portion 202; by the combination of the transmission channel decoding portion 202 and information source decoding process portion 203; or by the combination of the acquisition portion 201, transmission channel decoding portion 202, and information source decoding process portion 203.

[Second Configuration Example of the Reception System]

Figure 17:
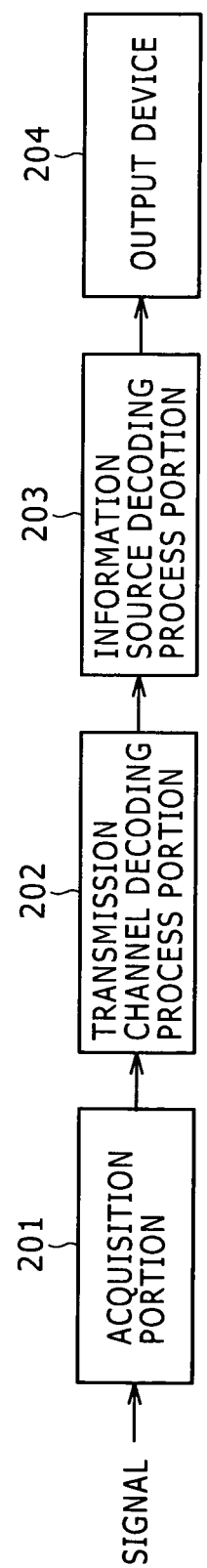
FIG. 17 is a block diagram showing a second configuration example of the reception system to which the reception apparatus of FIG. 1 may be applied.

FIG. 17 is a block diagram showing a second configuration example of the reception system to which the above-described reception apparatus 1 may be applied.

In FIG. 17, the components corresponding to those already shown in FIG. 16 are designated by like reference numerals, and their explanations may be omitted where appropriate in the ensuing description.

The reception system of FIG. 17 is common to the system of FIG. 16 in that it has the acquisition portion 201, transmission channel decoding process portion 202, and information source decoding process portion 203, and is different from the system of FIG. 16 in that it is furnished anew with an output portion 204.

For example, the output portion 204 may be a display unit for displaying images and/or speakers that output sounds. As such, the output portion 204 outputs images and sounds represented by the signal coming from the information source decoding process portion 204. That is, the output portion 204 displays images and/or outputs sounds.

The reception system of FIG. 17 outlined above may be applied to the TV set for receiving TV broadcasts as digital broadcasts and to the radio receiver for receiving radio broadcasts, for example.

If the signal acquired by the acquisition portion 201 has not undergone compression coding, then the signal output from the transmission channel decoding process portion 202 is passed on to the output portion 204.

[Third Configuration Example of the Reception System]

FIG. 18 is a block diagram showing a third configuration example of the reception system to which the above-described reception apparatus 1 may be applied.

In FIG. 18, the components corresponding to those already shown in FIG. 16 are designated by like reference numerals, and their explanations may be omitted where appropriate in the ensuing description.

The reception system of FIG. 18 is common to the system of FIG. 17 in that it has the acquisition portion 201 and transmission channel decoding process portion 202.

However, the reception system of FIG. 18 is different from the system of FIG. 17 in that it does not have the information source decoding process portion 203 and that it is furnished anew with a recording control portion 205 and a recording medium 206.

The recording control portion 205 controls recording of the signal output from the transmission channel decoding process portion 202 (e.g., TS (transport stream) packets in the MPEG format) to the recording medium 206 such as an optical disk, a hard disk (magnetic disk), or a flash memory.

The reception system of FIG. 18 outlined above may be applied to the recorder for recording TV broadcasts, among others.

Preferably, the reception system in FIG. 18 may be provided with the information source decoding process portion 203. In this setup, the signal having undergone the information source decoding process performed by the information source decoding process portion 203, i.e., images and sounds obtained through decoding, may be recorded by the recording control portion 205 to the recording medium 206.

[Applying the Present Disclosure to Program]

The series of the processes described above may be executed either by hardware or by software.

In any case, at least part of the reception system including the above-described reception apparatus 1 may be implemented in the form of a computer such as one shown in FIG. 19.

In FIG. 19, a CPU (central processing unit) 221 performs various processes in accordance with the programs recorded in a ROM (read only memory) 222 or in keeping with the programs loaded from a storage device 228 into a RAM (random access memory) 223. The RAM 223 may also store the data needed by the CPU 221 in carrying out diverse processing.

The CPU 221, ROM 222, and RAM 223 are interconnected via a bus 224. An input/output interface 225 is also connected to the bus 224.

The input/output interface 225 is connected with an input device 226, an output device 227, a storage device 228, and a communication device 229. The input device 226 may be typically made up of a keyboard and a mouse. The output device 227 may be constituted by a display unit or the like. The storage device 228 may be composed of a hard disk or the like. The communication device 229 may be formed by a modem and a terminal adapter, and control communications with another device (not shown) over networks including the Internet.

A drive 230 may be connected to the input/output interface 225 as needed. A piece of removable media 231 such as optical disks, magneto-optical disks or semiconductor memories is attached to the drive 230. Computer programs retrieved from the attached removable medium may be installed as needed into the storage device 228.

In this specification, the steps describing the programs stored on the recording medium represent not only the processes that are to be carried out in the depicted sequence (i.e., on a time series basis) but also processes that may be performed parallelly or individually and not necessarily chronologically.

In this specification, the term "system" refers to an entire configuration made up of a plurality of component devices and processing elements.

It should be understood by those skilled in the art that various modifications, combinations, sub-combinations and alterations may occur depending on design requirements and other factors in so far as they are within the scope of the appended claims or the equivalents thereof.

The present disclosure contains subject matter related to that disclosed in Japanese Priority Patent Application JP 2010-167312 filed in the Japan Patent Office on Jul. 26, 2010, the entire content of which is hereby incorporated by reference.

What is claimed is:

1. A reception apparatus comprising:
    a reception section configured to receive a signal that changes transmission frequencies;
    an image-rejection-ratio correction circuit configured to correct an image-rejection-ratio of the received signal based on a control signal; and
    a control section configured to:
        when the received signal changes to a first transmission frequency, set an initial value of the control signal based on a value of a first stored variable corresponding to the first transmission frequency;
        overwrite the first stored variable with a current value of the control signal obtained while the received signal is at the first transmission frequency; and
        upon receiving again the signal at the first transmission frequency, set the initial value of the control signal based on the value of the first stored variable as overwritten.

2. A reception apparatus comprising:
    a reception section that is configured to receive a signal that changes transmission frequencies, and that includes an automatic-gain-control loop that controls a gain of the received signal based on a control voltage and includes at least a loop filter circuit formed solely by analog circuitry; and
    a control section configured to:
        when the received signal changes to a first transmission frequency, set an initial value of the control voltage based on a value of a first stored variable corresponding to the first transmission frequency;
        overwrite the first stored variable with a current value of the control voltage obtained while the signal being received is at the first transmission frequency;
        upon receiving again the signal at the first transmission frequency, set the initial value of the control voltage based on the value of the first stored variable as overwritten, and
        input the control voltage at the initial value to the reception section by:
            stopping the automatic-gain-control-loop from controlling the gain of the received signal, and
            before allowing the automatic-gain-control loop to resume controlling the gain of the received signal, charging the loop filter circuit until the voltage of the loop filter circuit falls within a predetermined range of the initial value.

3. A reception apparatus comprising:
    a reception section configured to receive a signal that changes transmission frequencies;
    a frequency offset correction circuit configured to correct a frequency offset of the received signal based on a control signal; and
    a control section configured to:
        when the received signal changes to a first transmission frequency, set an initial value of the control signal based on a value of a first stored variable corresponding to the first transmission frequency;
        overwrite the first stored variable with a current value of the control signal obtained while the received signal is at the first transmission frequency; and
        upon receiving again the signal at the first transmission frequency, set the initial value of the control signal based on the value of the first stored variable as overwritten.

4. A reception apparatus comprising:
    an oscillator configured to generate an oscillation signal based on a modified-frequency-control signal;
    a reception section configured to receive a transmitted signal that changes transmission frequencies and to mix the transmitted signal with the oscillation signal;
    a frequency offset correction circuit configured to generate the modified-frequency-control signal by modifying an initial-frequency-control signal; and
    a control section configured to:
        when the transmitted signal changes to a first transmission frequency, set a value of the initial-frequency-control signal based on a value of a first stored variable corresponding to the first transmission frequency;
        overwrite the first stored variable with a current value of the modified-frequency-control signal obtained while the transmitted signal is at the first transmission frequency; and
        upon receiving again the transmitted signal at the first transmission frequency, set the value of the initial-frequency-control signal based on the value of the first stored variable as overwritten.

5. The reception apparatus according to claim 1, wherein the transmitted signal changes transmission frequencies at intervals of a predetermined time period.

6. A reception method for use with a reception apparatus that includes an image-rejection-ratio correction circuit configured to correct an image-rejection-ratio of the received signal based on a control signal, the reception method comprising:
    causing the reception apparatus to receive a signal that changes transmission frequencies;
    causing the reception apparatus to, when the received signal changes to a first transmission frequency, set an initial value of the control signal based on a value of a first stored variable corresponding to the first transmission frequency;
    causing the reception apparatus to overwrite the first stored variable with a current value of the control signal obtained while the received signal is at the first transmission frequency; and
    causing the reception apparatus to, upon receiving again the signal at the first transmission frequency, set the initial value of the control signal based on the value of the first stored variable as overwritten.

7. A non-transitory computer readable medium having program code for use with a computer stored thereon, the program code being executable by the computer to:
    cause the computer to receive a signal that changes transmission frequencies;
    cause the computer to, when the received signal changes to a first transmission frequency, set an initial value of the control signal based on a value of a first stored variable corresponding to the first transmission frequency,
    cause the computer to overwrite the first stored variable with a current value of the control signal obtained while the received signal is at the first transmission frequency; and
    cause the computer to, upon receiving again the signal at the first transmission frequency, set the initial value of the control signal based on the value of the first stored variable as overwritten.

* * * * *